US009336897B2

(12) United States Patent
Tobita et al.

(10) Patent No.: US 9,336,897 B2
(45) Date of Patent: May 10, 2016

(54) SHIFT REGISTER CIRCUIT

(75) Inventors: Youichi Tobita, Tokyo (JP); Isao Nojiri, Tokyo (JP); Seiichiro Mori, Tokyo (JP); Takashi Miyayama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 798 days.

(21) Appl. No.: 13/455,808

(22) Filed: Apr. 25, 2012

(65) Prior Publication Data

US 2012/0207266 A1    Aug. 16, 2012

Related U.S. Application Data

(62) Division of application No. 12/951,705, filed on Nov. 22, 2010, now Pat. No. 8,194,817.

(30) Foreign Application Priority Data

Dec. 11, 2009  (JP) .................................. 2009-281925

(51) Int. Cl.
| G11C 19/00 | (2006.01) |
| G11C 19/28 | (2006.01) |
| G09G 3/36 | (2006.01) |
| G11C 19/18 | (2006.01) |
| G09G 3/32 | (2016.01) |

(52) U.S. Cl.
CPC .............. G11C 19/28 (2013.01); G09G 3/3677 (2013.01); G11C 19/184 (2013.01); G09G 3/3266 (2013.01); G09G 2300/0408 (2013.01); G09G 2310/0286 (2013.01); G09G 2320/0233 (2013.01)

(58) Field of Classification Search
None
See application file for complete search history.

(56) References Cited

U.S. PATENT DOCUMENTS 7,120,221 B2   10/2006 Moon
7,420,536 B2 *  9/2008 Jang et al. ...................... 345/100
(Continued)

FOREIGN PATENT DOCUMENTS

| JP | 9-284112 | 10/1997 |
| JP | 10-163840 | 6/1998 |

(Continued)

OTHER PUBLICATIONS

Office Action issued Aug. 20, 2013, in Japanese Patent Application No. 2009-281925 filed Dec. 11, 2009 (with Partial English-language Translation).

*Primary Examiner* — Tuan T Lam
(74) *Attorney, Agent, or Firm* — Oblon, McClelland, Maier & Neustadt, L.L.P.

(57) ABSTRACT

A shift register circuit comprises a first transistor connected between a clock terminal and an output terminal, a second transistor for charging a control electrode of the first transistor in response to activation of an output signal of the preceding stage, a third transistor for discharging the control electrode of the first transistor, an inverter using a control electrode of the third transistor as an output end, and a fourth transistor which discharges an input end of the inverter at power-off and is turned off after power-on. A fifth transistor which is a load element of the inverter charges the control electrode of the third transistor at power-on. It is thereby possible to initialize the respective levels of the nodes without any external initialization signal and prevent a decrease in the level change rate of the output signal in the shift register circuit.

3 Claims, 14 Drawing Sheets

(56) References Cited

U.S. PATENT DOCUMENTS

| | | |
|---|---|---|
| 7,443,944 B2 * | 10/2008 | Tobita et al. .................. 377/64 |
| 7,499,518 B2 | 3/2009 | Tobita et al. |
| 8,121,244 B2 * | 2/2012 | Kim .................. 377/64 |
| 8,194,817 B2 | 6/2012 | Tobita et al. |
| 2002/0097829 A1 | 7/2002 | Kawahata |
| 2003/0227433 A1 | 12/2003 | Moon |
| 2004/0165692 A1 | 8/2004 | Moon et al. |
| 2004/0189585 A1 | 9/2004 | Moon |
| 2006/0001637 A1 | 1/2006 | Pak et al. |
| 2006/0038500 A1 | 2/2006 | Lee et al. |
| 2006/0139292 A1 * | 6/2006 | Yoon et al. .................. 345/100 |
| 2006/0220587 A1 | 10/2006 | Tobita et al. |
| 2006/0256066 A1 | 11/2006 | Moon |
| 2006/0290390 A1 * | 12/2006 | Jang et al. .................. 327/112 |
| 2007/0177438 A1 | 8/2007 | Moon et al. |
| 2007/0217564 A1 * | 9/2007 | Tobita .................. 377/64 |
| 2007/0274433 A1 | 11/2007 | Tobita |
| 2008/0002805 A1 | 1/2008 | Tobita et al. |
| 2008/0101529 A1 | 5/2008 | Tobita |
| 2008/0116944 A1 * | 5/2008 | Tobita et al. .................. 327/142 |
| 2010/0111245 A1 | 5/2010 | Tobita |
| 2011/0122988 A1 * | 5/2011 | Miyayama et al. .................. 377/64 |
| 2011/0228893 A1 | 9/2011 | Tobita et al. |
| 2011/0255653 A1 * | 10/2011 | Chae .................. 377/79 |
| 2012/0113088 A1 * | 5/2012 | Han et al. .................. 345/212 |

FOREIGN PATENT DOCUMENTS

| | | |
|---|---|---|
| JP | 2002-133890 | 5/2002 |
| JP | 2004-157508 | 6/2004 |
| JP | 2004-246358 | 9/2004 |
| JP | 2004-295126 | 10/2004 |
| JP | 2006-24350 | 1/2006 |
| JP | 2006-60225 | 3/2006 |
| JP | 2006-277860 | 10/2006 |
| JP | 2006-344306 | * 12/2006 |
| JP | 2007-35188 | 2/2007 |
| JP | 2007-179660 | 7/2007 |
| JP | 2007-207411 | 8/2007 |
| JP | 2007-250052 | 9/2007 |
| JP | 2007-257813 | 10/2007 |

* cited by examiner

F I G . 4
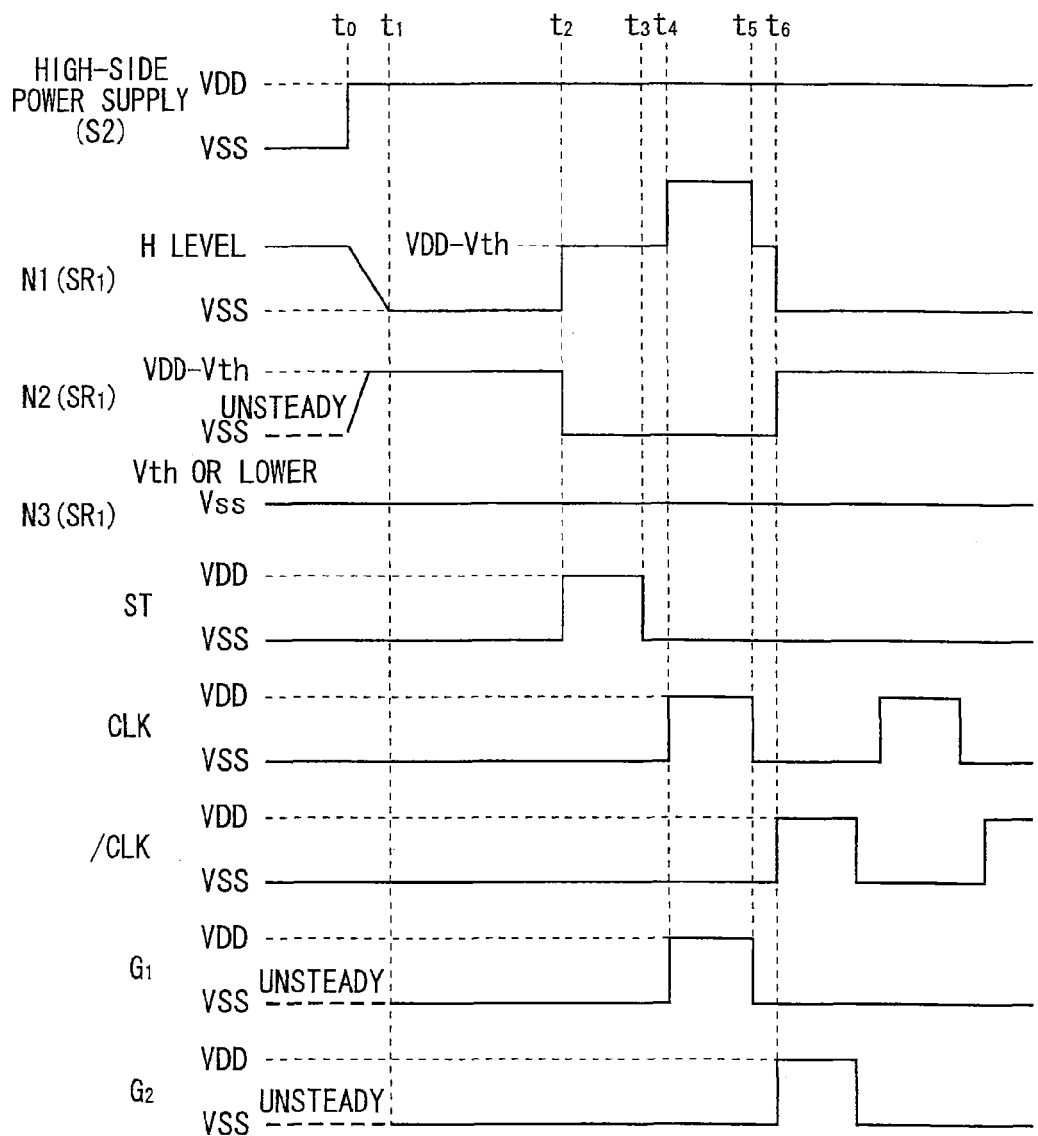

F I G . 7
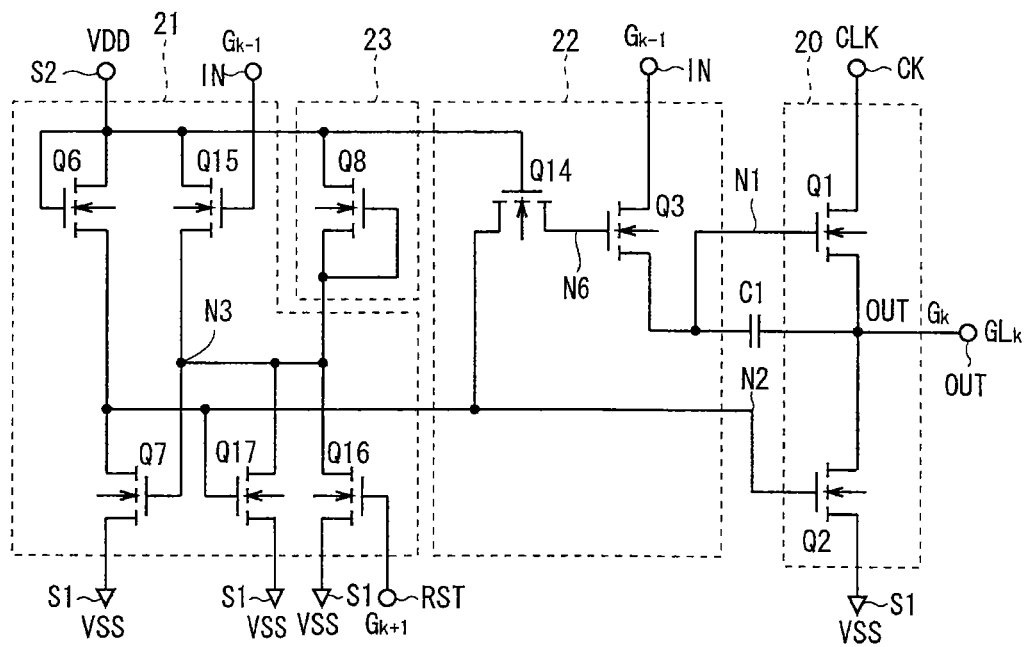

SHIFT REGISTER CIRCUIT

CROSS-REFERENCE TO RELATED APPLICATIONS

This application is a division of and claims the benefit of priority under 35 U.S.C. §120 from U.S. Ser. No. 12/951,705 filed Nov. 22, 2010, now U.S. Pat. No. 8,194,817, the entire content of which are incorporated herein by reference. U.S. Ser. No. 12/951,705 claims the benefit of priority under 35 U.S.C. §119 from Japanese Application No. 2009-281925, filed respectively on Dec. 11, 2009.

BACKGROUND OF THE INVENTION

1. Field of the Invention

The present invention relates to a scanning line driving circuit, and more particularly to a shift register circuit which is a constituent of the scanning line driving circuit which is used in an electro-optic device such as an image display device, an image sensor, or the like and consists of only field effect transistors of the same conductivity type.

2. Description of the Background Art

In an image display device (hereinafter, referred to as a "display device") such as a liquid crystal display, a plurality of pixels are arranged in a matrix in a display panel and a gate line (scanning line) is provided for each row of pixels (pixel line) in the display panel. In a cycle of one horizontal period (1H period) of a display signal, the gate lines are sequentially selected and driven, to update a display image. As a gate line driving circuit (scanning line driving circuit) for sequentially selecting and driving the pixel lines, i.e., the gate lines, a shift register may be used, which performs a round of shift operation in one frame period of the display signal.

A shift register as a gate line driving circuit consists of a plurality of cascaded shift register circuits each of which is provided for one pixel line, i.e., one gate line. In this specification, each of a plurality of shift register circuits which constitute a gate line driving circuit is referred to as a "unit shift register". Specifically, an output terminal of each of the unit shift registers constituting the gate line driving circuit is connected not only to a corresponding gate line but also to an input terminal of the subsequent-stage or post-stage unit shift register.

In order to reduce the number of steps in a manufacturing process for a display device, it is preferable that the shift register used in the gate line driving circuit should be constituted of only field effect transistors of the same conductivity type. For this reason, various types of shift registers constituted of only N-type or P-type field effect transistors and various types of display devices each containing such shift registers have been proposed (e.g., Japanese Patent Application Laid Open Gazette No. 2007-35188 (Patent Documents 1), Japanese Patent Application Laid Open Gazette No. 2006-60225 (Patent Documents 2), Japanese Patent Application Laid Open Gazette No. 2004-157508 (Patent Documents 3), Japanese Patent Application Laid Open Gazette No. 2006-24350 (Patent Documents 4), Japanese Patent Application Laid Open Gazette No. 2004-295126 (Patent Documents 5), Japanese Patent Application Laid Open Gazette No. 2002-133890 (Patent Documents 6), Japanese Patent Application Laid Open Gazette No. 2007-250052 (Patent Documents 7), Japanese Patent Application Laid Open Gazette No. 2006-277860 (FIGS. 1, 2, and 3) (Patent Documents 8), Japanese Patent Application Laid Open Gazette No. 2004-246358 (FIG. 1) (Patent Documents 9), and Japanese Patent Application Laid Open Gazette No. 2006-344306 (FIG. 11) (Patent Documents 10)).

FIG. 6 of Patent Documents 1 is a circuit diagram showing a background-art unit shift register constituted of only PMOS transistors. An output signal (OUT) of the unit shift register is activated when a clock signal (C1) is supplied to an output terminal through a transistor (T2) (hereinafter, referred to as a "pull-up transistor") which brings an output into an active level (L (Low) level herein). High driving capability (capability of carrying current) is required of the pull-up transistor, particularly, since a unit shift register used in a gate line driving circuit drives a gate line which is a large load capacitance by using an output signal. For this reason, an on-state resistance of the pull-up transistor is set very low.

In a normal operation (operation of shifting a signal) of the unit shift register, the pull-up transistors of all the stages are sequentially turned on so that respective output signals of a plurality of cascaded unit shift registers may be sequentially activated. In a state where the potentials of the nodes in the circuit are unsteady, such as immediately after power-on, however, the pull-up transistors of the plurality of unit shift registers are in an ON state in some cases. At that time, if the clock signal is activated, excessive current undesirably flows through the plurality of pull-up transistors of which the on-state resistances are low.

Against the above problem, a countermeasure is taken in the unit shift register shown in FIG. 6 of Patent Documents 1. Specifically, in the unit shift register, a transistor (T7a) (hereinafter, referred to as an "initializing transistor") which is controlled by an initialization signal (SHUT) is connected between a gate of the pull-up transistor and a power supply (VDD) of inactive level (H (High) level herein). Before the normal operation, the initializing transistors of all the unit shift registers are thereby turned on temporarily by using the initialization signal. In all the unit shift registers, gate potentials of the pull-up transistors are thereby initialized to an inactive level, to get out of the unsteady state. As a result, since all the pull-up transistors are turned off, even if the clock signal is activated, no excessive current flows through the plurality of pull-up transistors.

In the unit shift register shown in FIG. 6 of Patent Documents 1, however, providing the initializing transistor (T7a) causes another problem. Hereafter, this problem will be discussed.

In the unit shift register, when the output signal (OUT) is activated, the gate potential of the pull-up transistor (T2) is lowered by coupling through a gate-channel capacitance (MOS capacitance) of the pull-up transistor. Since an absolute value of a gate-source voltage of the pull-up transistor is thereby maintained large, the on-state resistance of the pull-up transistor can be maintained low and it is possible to prevent a decrease in the rate of change of the output signal to the active level (fall of the output signal herein). This effect is increased as the fall range of the gate potential of the pull-up transistor becomes larger. Since the fall range depends on a ratio between the MOS capacitance of the pull-up transistor and a parasitic capacitance of a node (n2) connected to the gate, it is preferable that the parasitic capacitance of the node connected to the gate of the pull-up transistor should be smaller.

Since the above-described initializing transistor (T7a) is connected to the gate of the pull-up transistor in the unit shift register, however, the parasitic capacitance of the node connected to the gate of the pull-up transistor becomes larger by a drain-gate capacitance of the initializing transistor. As a result, if the gate potential of the pull-up transistor does not sufficiently fall when the output signal is activated, there arises a problem that the driving capability of the pull-up transistor decreases and the falling rate of the output signal decreases.

Further, in a case where the initialization signal (SHUT) is externally inputted, like in the unit shift register shown in FIG. 6 of Patent Documents 1, it is necessary to provide a circuit for generating the initialization signal as an external circuit and this causes an increase of the manufacturing cost.

SUMMARY OF THE INVENTION

It is a first object of the present invention to provide a shift register circuit which has an initializing function for initializing the levels of nodes and is capable of preventing a decrease in the rate of change of an output signal to an active level. It is a second object of the present invention to provide a shift register circuit which does not need a control signal (initialization signal) for an initializing circuit to be externally supplied.

The present invention is intended for a shift register circuit. According to a first aspect of the present invention, the shift register circuit includes an input terminal, an output terminal, a clock terminal, first to third transistors described below, an inverter, and a first unidirectional element. The first transistor supplies the output terminal with a clock signal inputted to the clock terminal. The second transistor charges a first node connected to a control electrode of the first transistor in response to activation of an input signal inputted to the input terminal. The third transistor discharges the first node. The inverter is supplied with a power supply of active level and uses a second node connected to a control electrode of the third transistor as an output end. The first unidirectional element discharges a third node connected to an input end of the inverter when the power supply is inactive, and the first unidirectional element is turned off when the power supply is active. The inverter includes a load element for charging the second node when the power supply is active.

By the shift register circuit, the first node is initialized to an inactive level in response to power-on. Therefore, the first transistor is turned off and even if the clock signal is activated before start of a normal operation, it is possible to prevent excessive current from flowing through the first transistor. Further, since the first node can be inactivated by the power-on, no external reset signal is needed.

Initialization of the first node is performed when the inverter turns the third transistor on in response to the power-on. The third transistor is used to fix the first node to the inactive level during a non-selection period in the normal operation and included also in the background-art shift register circuit. In the other words, in the present invention, no additional circuit element for initializing the first node needs to be connected. The parasitic capacitance of the first node is accordingly the same as that in the background-art unit shift register. The effect of boosting the voltage of the first node at activation of an output signal does not decrease and no rise of the on-state resistance of the first transistor is involved. Therefore, it is possible to prevent a decrease in the rate of the activation of the output signal (the charge rate of the output terminal).

According to a second aspect of the present invention, the shift register circuit includes an input terminal, an output terminal, and a clock terminal, first to fifth transistors described below, and a driving circuit. The first transistor supplies the output terminal with a clock signal inputted to the clock terminal. The second and third transistors each discharge the output terminal. The driving circuit drives the second transistor when a first control signal is active, and the driving circuit drives the third transistor when a second control signal is active. Nodes connected to respective control electrodes of the first, second, and third transistors are defined as first, second, and third nodes, respectively. The fourth transistor has a control electrode connected to the second node and discharges the first node. The fifth transistor has a control electrode connected to the third node and discharges the first node. In the shift register circuit of the present invention, at least one of the first and second control signals is activated for a predetermined time period before the clock signal starts operating after power-on.

By the shift register circuit, since at least one of the first and second control signals is activated at power-on, the second or third node is brought into an active level by the driving circuit. Either the fourth or fifth transistor is thereby turned on and the first node is initialized to an inactive level. Therefore, no external reset signal is needed.

The fourth and fifth transistors are included also in the shift register circuit which is an underlying technology (Japanese Patent Application Laid Open Gazette No. 2008-130139). In other words, no additional circuit element for initializing the first node needs to be connected. The parasitic capacitance of the first node is accordingly the same as that of the unit shift register of the underlying technology. Therefore, it is possible to prevent a decrease in the rate of the activation of the output signal (the charge rate of the output terminal).

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a signal waveform chart showing an operation of the unit shift register in accordance with the first preferred embodiment;

FIG. 7 is a circuit diagram showing a unit shift register in accordance with a third variation of the first preferred embodiment;

DESCRIPTION OF THE PREFERRED EMBODIMENTS

Figure 1:
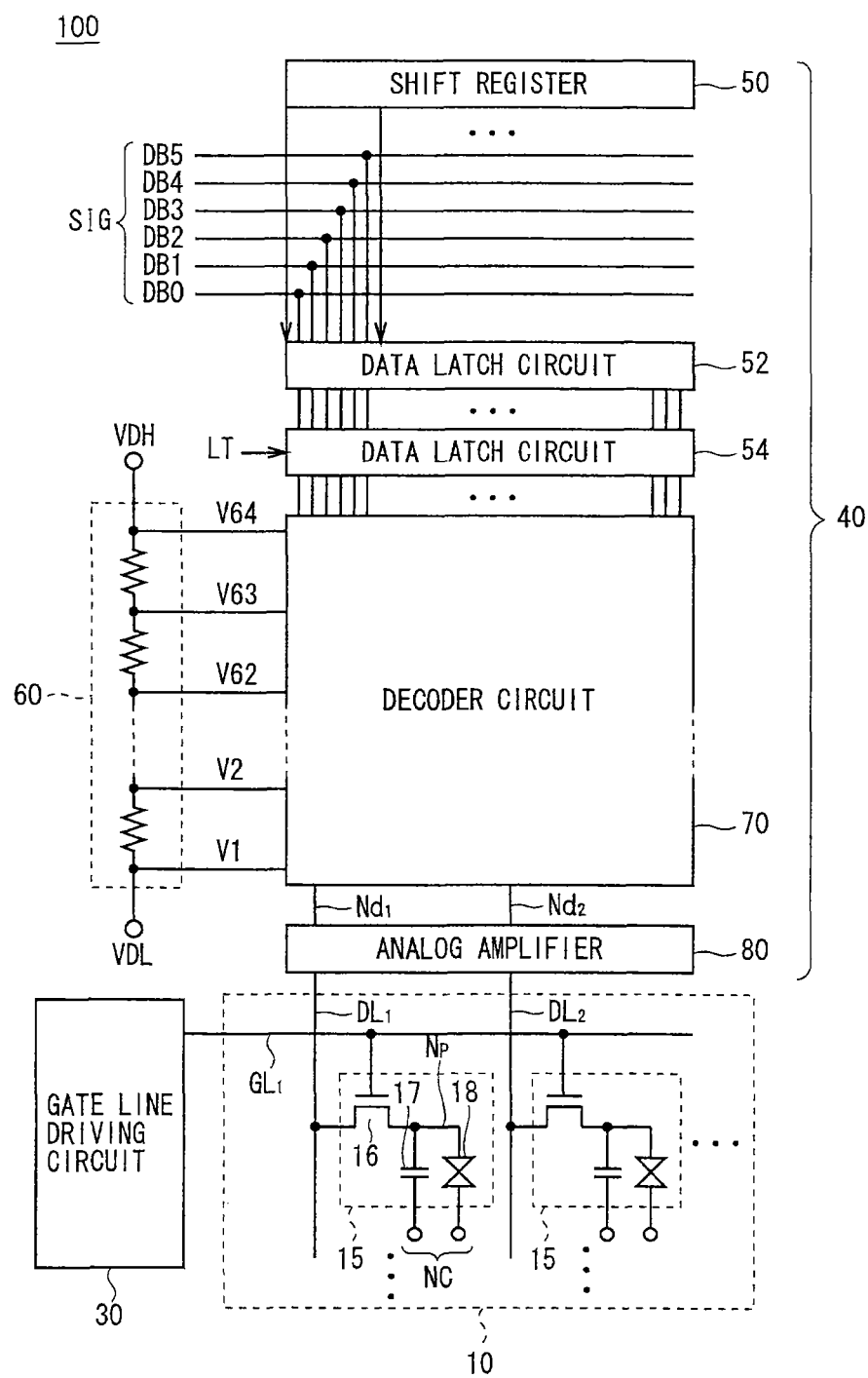
FIG. 1 is a schematic block diagram showing a liquid crystal display in accordance with a first preferred embodiment of the present invention.

Hereinafter, the preferred embodiments of the present invention will be discussed with reference to accompanied drawings. To avoid repeated and redundant description, elements having the same or corresponding functions are represented by the same reference signs in the drawings.

Transistors used in the preferred embodiments are insulated gate field effect transistors. In the insulated gate field effect transistor, electric conductivity between a drain region and a source region in a semiconductor layer is controlled by an electric field in a gate insulating film. As a material of the semiconductor layer in which the drain region and the source region are formed, used is an organic semiconductor such as polysilicon, amorphous silicon, or pentacene, a single crystalline silicon, an oxide semiconductor such as IGZO (In—Ga—Zn—O), or the like.

As well known, a transistor is an element having at least three electrodes including a control electrode (in a narrow sense, a gate (electrode)), one current electrode (in a narrow sense, a drain (electrode) or a source (electrode)), and the other current electrode (in a narrow sense, a source (electrode) or a drain (electrode)). The transistor functions as a switching element in which a channel is formed between its drain and its source by applying a predetermined voltage to its gate. The drain and the source of the transistor basically have the same structure and their names are interchanged with each other depending on the applied voltage condition. In the case of an N-type transistor, for example, an electrode with relatively high potential is referred to as a drain and another electrode with relatively low potential is referred to as a source (that is reversed in the case of a P-type transistor).

These transistors may be formed on a semiconductor substrate or may be thin film transistors (TFT) formed on an insulating substrate such as a glass unless otherwise indicated. As a substrate on which the transistors are formed, a single crystal substrate, a SOI substrate, or an insulating substrate such as a glass or a resin may be used.

A gate line driving circuit of the present invention consists of only transistors of the same conductivity type. An N-type transistor, for example, is brought into an active state (ON state, or conducting state) when its gate-source voltage is brought into an H (High) level where it is higher than a threshold voltage of the transistor. The N-type transistor is brought into an inactive state (OFF state, or non-conducting state) when its gate-source voltage is brought into an L (Low) level where it is lower than the threshold voltage. Therefore, the H level of a signal is an "active level" and the L level is an "inactive level" in a circuit using the N-type transistors. Nodes in the circuit using the N-type transistors are changed from the inactive level to the active level when charged into the H level. The nodes are changed from the active level to the inactive level when discharged into the L level.

Conversely, a P-type transistor is brought into an active state (ON state, or conducting state) when its gate-source voltage is brought into an L level where it is lower than a threshold voltage (having a negative value with its source as a reference) of the transistor. The P-type transistor is brought into an inactive state (OFF state, or non-conducting state) when its gate-source voltage is brought into an H level where it is higher than the threshold voltage. Therefore, the L level of a signal is an "active level" and the H level is an "inactive level" in a circuit using the P-type transistors. As to nodes in the circuit using the P-type transistors, the relation between charge and discharge is the reverse of that in the N-type transistors. Specifically, the nodes in the circuit using the P-type transistors are changed from the inactive level to the active level when charged into the L level. The nodes are changed from the active level to the inactive level when discharged into the H level.

In this specification, the change from the inactive level to the active level is defined as "pull-up" and the change from the active level to the inactive level is defined as "pull-down". Specifically, in the circuit using the N-type transistors, the change from the L level to the H level is defined as "pull-up" and the change from the H level to the L level is defined as "pull-down". In the circuit using the P-type transistors, the change from the H level to the L level is defined as "pull-up" and the change from the L level to the H level is defined as "pull-down".

Further, in this specification, "connection" between two elements, between two nodes, or between one element and one node is made through other element(s) (an element, a switch, or the like) but will be discussed as connection including a state which is substantially equivalent to direct connection. Even in a case where two elements are connected to each other through a switch, for example, if these elements can function in the same manner as in the case where these elements are directly connected to each other, these elements are described as "being connected to each other".

In the present invention, clock signals having different phases (multiphase clock signals) are used. Hereinafter, for simple discussion, a certain interval is provided between an active period of one clock signal and that of another clock signal to be activated next (e.g., an interval between the time $t_5$ and the time $t_6$ in FIG. 4). In the present invention, however, respective active periods of the clock signals have only not to substantially overlap each other and the above-discussed interval is not always needed. Assuming that the active level is H level, for example, the fall timing of one clock signal may be the same as the rise timing of another clock signal to be activated next.

<The First Preferred Embodiment>

FIG. 1 is a schematic block diagram showing a configuration of a display device in accordance with the first preferred embodiment of the present invention. As a typical example of the display device, an overall configuration of a liquid crystal display 100 is shown. The present invention, however, is not applied only to a liquid crystal display but may be also widely applied to electro-optic devices including display devices which convert an electrical signal into the luminance of light, such as an electroluminescence (EL), an organic EL, a plasma display, and electronic paper, image pickup devices (image sensors) which convert the intensity of light into an electrical signal, or the like.

The liquid crystal display 100 comprises a liquid crystal array unit 10, a gate line driving circuit (scanning line driving circuit) 30, and a source driver 40. As can be seen clearly from later discussion, a gate line driving signal generation circuit of the preferred embodiments of the present invention is included in the gate line driving circuit 30.

The liquid crystal array unit 10 includes a plurality of pixels 15 which are arranged in a matrix. Rows of the pixels (hereinafter, also referred to as "pixel lines") are respectively provided with gate lines $GL_1$, $GL_2$, ... (hereinafter, also generically referred to as a "gate line GL"), and columns of the pixels (hereinafter, also referred to as "pixel rows") are respectively provided with data lines $DL_1$, $DL_2$, ... (hereinafter, generically referred to as a "data line DL"). FIG. 1 representatively shows the pixels 15 of the first and second columns in the first row and the corresponding data lines $DL_1$ and $DL_2$ and the corresponding gate line $GL_1$.

Each pixel 15 has a pixel switching element 16 disposed between the corresponding data line DL and a pixel node Np, and a capacitor 17 and a liquid crystal display element 18 which are connected in parallel between the pixel node Np and a common electrode node NC. The crystal orientation in the liquid crystal display element 18 changes in accordance with the voltage difference between the pixel node Np and the common electrode node NC, and in response to this change, the display luminance of the liquid crystal display element 18 changes. Therefore, the luminance of each pixel can be controlled by a display voltage transmitted to the pixel node Np through the data line DL and the pixel switching element 16. In other words, an intermediate voltage difference between a voltage difference corresponding to the maximum luminance and a voltage difference corresponding to the minimum luminance is applied between the pixel node Np and the common electrode node NC, and halftone luminance can be thereby obtained. Therefore, by setting the above display voltages stepwise, grayscale luminance can be obtained.

The gate line driving circuit 30 sequentially selects and drives a gate line GL on the basis of a predetermined scanning cycle. The pixel switching element 16 has a gate electrode connected to a corresponding gate line GL. While a certain gate line GL is selected, the pixel switching element 16 is brought into the conducting state in each of the pixels connected to the selected gate line GL, and the pixel node Np is thereby connected to the corresponding data line DL. Then, the display voltage transmitted to the pixel node Np is held by the capacitor 17. In general, the pixel switching element 16 is a TFT formed on an insulating substrate (a glass substrate, a resin substrate, or the like) on which the liquid crystal display element 18 is also formed.

The source driver 40 is provided to output the display voltages which are set stepwise by a display signal SIG which is an N-bit digital signal, to the data lines DL. As an example, the display signal SIG is assumed to be a 6-bit signal including display signal bits DB0 to DB5. With such a 6-bit display signal SIG, $2^6=64$ levels of gray can be displayed in each pixel. Further, a display of approximately 260 thousand colors can be achieved when one color display unit is formed by three pixels of R (Red), G (Green) and B (Blue).

As shown in FIG. 1, the source driver 40 is constituted of a shift register 50, data latch circuits 52 and 54, a gradation voltage generating circuit 60, a decoder circuit 70 and an analog amplifier 80.

In the display signal SIG, the display signal bits DB0 to DB5 corresponding to the display luminance of each pixel 15 are serially generated. In other words, the display signal bits DB0 to DB5 at each timing indicate the display luminance of any one pixel 15 in the liquid crystal array unit 10.

The shift register 50 gives an instruction to the data latch circuit 52 to capture the display signal bits DB0 to DB5 in synchronization with a cycle during which the setting of the display signal SIG is changed. The data latch circuit 52 sequentially captures serially-generated display signals SIG to latch the display signals SIG for one pixel line.

A latch signal LT inputted to the data latch circuit 54 is activated at the timing when the display signals SIG for one pixel line are captured by the data latch circuit 52. In response to this, the data latch circuit 54 captures the display signals SIG for one pixel line which are latched by the data latch circuit 52 at that time.

The gradation voltage generating circuit 60 consists of 63 voltage-dividing resistors which are connected in series between a high voltage VDH and a low voltage VDL, for generating 64 levels of gradation voltages V1 to V64, respectively.

The decoder circuit 70 decodes the display signals SIG latched by the data latch circuit 54, and on the basis of the result of decoding, selects voltages to be respectively outputted to decoder output nodes $Nd_1$, $Nd_2$, ... (generically referred to as a "decoder output node Nd") out of the gradation voltages V1 to V64 and outputs the selected voltages.

As a result, the display voltages (one out of the gradation voltages V1 to V64) corresponding to the display signals SIG for one pixel line, which are latched by the data latch circuit 54, are outputted to the decoder output nodes Nd at the same time (in parallel). FIG. 1 representatively shows the decoder output nodes $Nd_1$ and $Nd_2$ corresponding to the data line $DL_1$ of the first column and the data line $DL_2$ of the second column, respectively.

The analog amplifier 80 current-amplifies and outputs analog voltages corresponding to the display voltages outputted from the decoder circuit 70 to the decoder output nodes $Nd_1$, $Nd_2$, ..., to the data lines $DL_1$, $DL_2$, ..., respectively.

The source driver 40 repeatedly outputs the display voltages corresponding to a series of display signals SIG to the data lines DL by the pixel line on the basis of a predetermined scanning cycle, and the gate line driving circuit 30 sequentially drives the gate lines $GL_1$, $GL_2$, ... in synchronization with the scanning cycle, to thereby display an image on the basis of the display signals SIG on the liquid crystal array unit 10.

Though FIG. 1 shows an exemplary configuration of the liquid crystal display 100 with the gate line driving circuit 30 and source driver 40 formed integrally with the liquid crystal array unit 10, there may be a case where the gate line driving circuit 30 is formed integrally with the liquid crystal array unit 10 and the source driver 40 is provided as an external circuit of the liquid crystal array unit 10 or there may be another case where the gate line driving circuit 30 and source driver 40 are provided as external circuits of the liquid crystal array unit 10.

Figure 2:
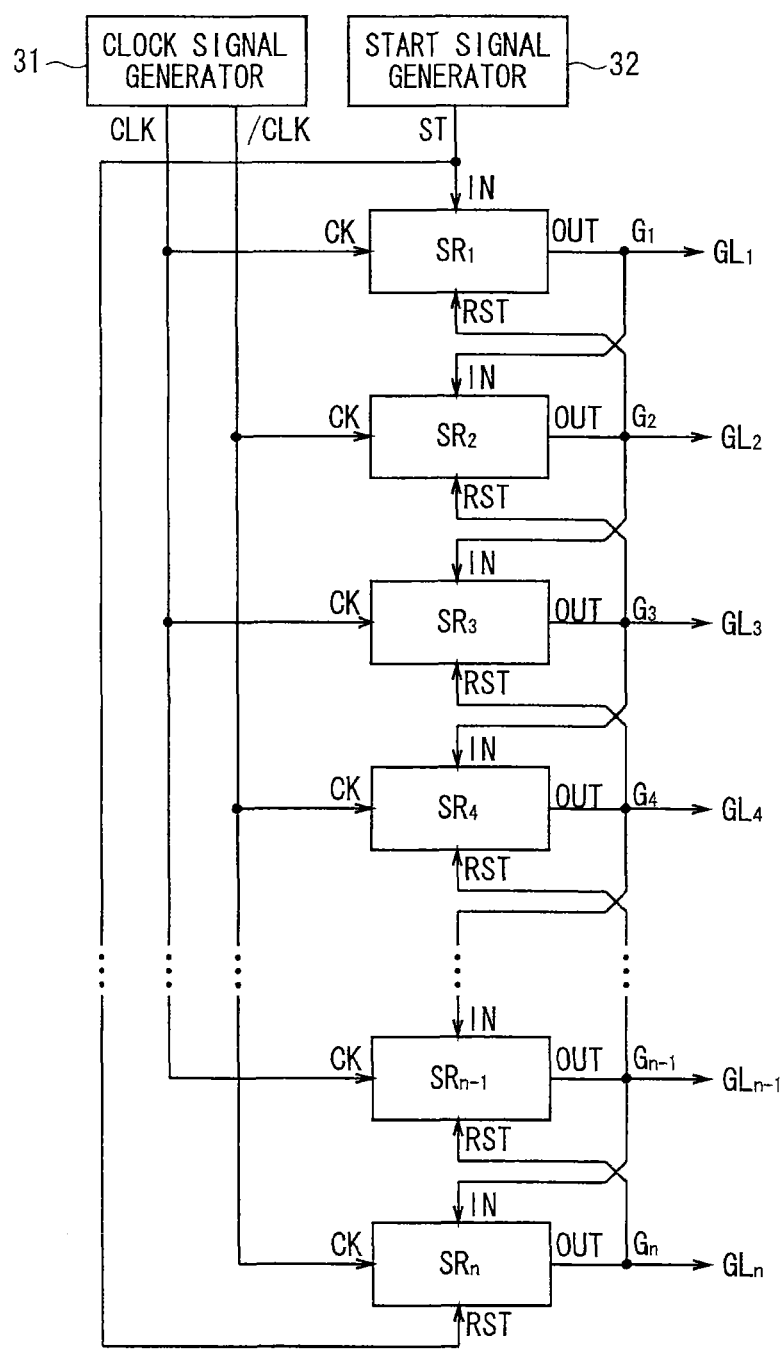
FIG. 2 is a view showing a configuration of a gate line driving circuit in accordance with the first preferred embodiment.

FIG. 2 is a view showing a configuration of the gate line driving circuit 30 in accordance with the first preferred embodiment. The gate line driving circuit 30 includes a shift register constituted of a plurality of unit shift registers $SR_1$, $SR_2$, $SR_3$, $SR_4$, ... which are connected in cascade (for convenience of description, each of the shift register circuits $SR_1$, $SR_2$, ... is generically called a "unit shift register SR"). Each unit shift register SR is provided for one pixel line, i.e., one gate line GL.

A clock signal generator 31 shown in FIG. 2 is provided to input two clock signals CLK and /CLK of which the phases are different (the respective active periods do not overlap each other) to the unit shift registers SR of the gate line driving circuit 30. These clock signals CLK and /CLK are controlled to be alternately activated in synchronization with the scanning cycle of the display device.

Each unit shift register SR has an input terminal IN, an output terminal OUT, a clock terminal CK, and a reset terminal RST. As shown in FIG. 2, the clock terminal CK of each unit shift register SR is supplied with either one of the clock signals CLK and /CLK. Specifically, the clock signal CLK is supplied for the unit shift registers of the odd-number stages, SR$_1$, SR$_3$, SR$_5$, ..., and the clock signal /CLK is supplied for the unit shift registers of the even-number stages, SR$_2$, SR$_4$, SR$_6$, ... In the exemplary case of FIG. 2, the n-th stage which is the last stage is an even-number stage and the unit shift register SR$_n$ of this stage is supplied with the clock signal /CLK.

A start signal generator 32 generates a start pulse ST for causing the gate line driving circuit 30 to start an operation of shifting a signal. In the first preferred embodiment, the start pulse ST is activated (brought into the H level) at a timing corresponding to the beginning of each frame period of an image signal.

A start pulse ST is inputted to the input terminal IN of the unit shift register SR$_1$ of the first stage. As to each of the unit shift registers SR of the second or following stages, the input terminal IN is connected to the output terminal OUT of the unit shift register SR of the preceding stage.

The reset terminal RST of each unit shift register SR is connected to the output terminal OUT of the unit shift register SR of the subsequent stage. To the reset terminal RST of the unit shift register SR$_n$ of the last stage, however, the above-described start pulse ST is inputted.

In other words, an output signal G outputted from the output terminal OUT of each unit shift register SR is supplied as a vertical (horizontal) scanning pulse to the corresponding gate line GL and also supplied to the input terminal IN of its subsequent stage and the reset terminal RST of its preceding stage.

In the gate line driving circuit 30 shown in FIG. 2, each unit shift register SR transmits a signal (the start pulse ST or the output signal outputted from its preceding stage) inputted to the input terminal IN to the corresponding gate line GL and its subsequent-stage unit shift register SR in synchronization with the clock signals CLK and /CLK while shifting the signal with time (an operation of the unit shift register SR will be described later in detail). As a result, a series of unit shift registers SR serve as a gate line driving unit for sequentially activating the gate lines GL at a timing on the basis of the predetermined scanning cycle.

The unit shift register SR of the first preferred embodiment has an initializing function (initial reset operation) for initializing respective potentials of the nodes of its circuit to specific levels. Normally, though the respective potentials of the nodes in the circuit of the shift register are unstable immediately after power-on or the like, the respective potentials of the nodes in each unit shift register SR are initialized to predetermined levels and get out of the unstable state in the gate line driving circuit 30 of the first preferred embodiment.

Figure 3:
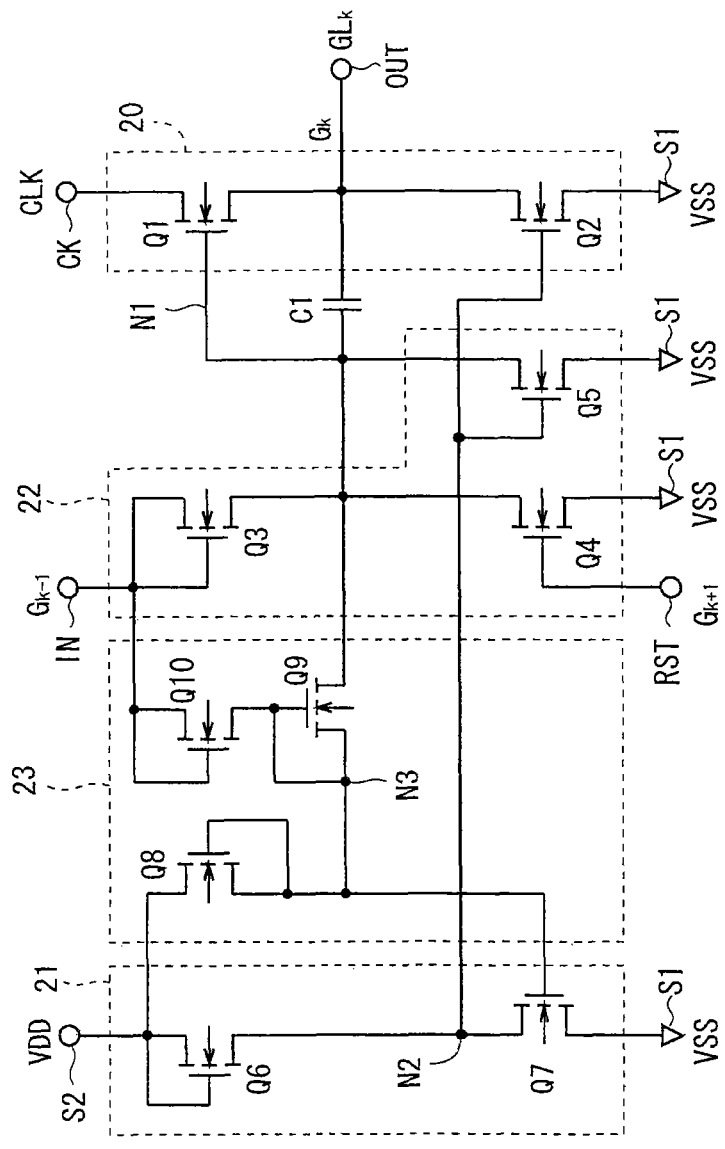
FIG. 3 is a circuit diagram showing a unit shift register in accordance with the first preferred embodiment.

FIG. 3 is a circuit diagram showing a configuration of the unit shift register in accordance with the first preferred embodiment of the present invention. Since all the unit shift registers SR which constitute the gate line driving circuit 30 have the same configuration, the configuration of the unit shift register SRk of the k-th stage is representatively shown.

All the transistors constituting the unit shift register SRk of the present invention are field effect transistors of the same conductivity type, and in the following preferred embodiments, discussion will be made assuming that these transistors are all N-type TFTs. Further, it is assumed that respective threshold voltages of these transistors are all equal, taking a value Vth.

As shown in FIG. 3, the unit shift register SRk has a first power supply terminal S1 supplied with a low-side power supply potential VSS, and a second power supply terminal S2 supplied with a high-side power supply potential VDD, as well as the input terminal IN, the output terminal OUT, the clock terminal CK, and the reset terminal RST shown in FIG. 2. In the following description, the low-side power supply potential VSS is 0V and defined as a reference potential of the circuit. In practical use, however, a reference potential is determined with reference to a voltage of data to be written into the pixels. For example, the high-side power supply potential VDD may be set at 17V, and the low-side power supply potential VSS may be set at −12V.

As shown in FIG. 3, the unit shift register SR$_k$ is constituted of an output circuit unit 20, a pull-down driving circuit unit 21, a pull-up driving circuit unit 22, and an initial reset circuit unit 23.

The output circuit unit 20 is provided to activate or inactivate the output signal G$_k$ and includes a transistor Q1 (output pull-up transistor) for bring the output signal G$_k$ into the active level (H level) during a selection period of the gate line GL$_k$ and a transistor Q2 (output pull-down transistor) for bring the output signal G$_k$ into the inactive level (L level) during a non-selection period of the gate line GL$_k$.

The transistor Q1 is connected between the output terminal OUT and the clock terminal CK and supplies the clock signal inputted to the clock terminal CK to the output terminal OUT, to thereby activate the output signal G$_k$. Since the output signal G$_k$ is used to activate the gate line GL$_k$ which is a large capacitance load, high driving capability is required of the transistor Q1. Therefore, an on-state resistance (impedance) of the transistor Q1 is set sufficiently low. The transistor Q2 is connected between the output terminal OUT and the first power supply terminal S1 and discharges the output terminal OUT until it has the potential VSS, to thereby maintain the output signal G$_k$ at the inactive level. Herein, the node connected to the gate (control electrode) of the transistor Q1 is defined as a "node N1".

A capacitive element C1 is connected between the gate and the source of the transistor Q1 (in other words, between the output terminal OUT and the node N1). The capacitive element C1 is provided to increase the effect of boosting the voltage of the node N1 which is caused by the level rise of the output terminal OUT. In a case where the gate-channel capacitance of the transistor Q1 is sufficiently large, however, the capacitive element C1 may be omitted since it can be substituted by the gate-channel capacitance.

The pull-down driving circuit unit 21 consists of transistors Q6 and Q7 which are connected in series between the second power supply terminal S2 and the first power supply terminal S1. When a connection node between the transistors Q6 and Q7 is defined as a "node N2", the transistor Q6 is connected between the node N2 and the second power supply terminal S2 and the gate thereof is connected to the second power supply terminal S2 (in other words, the transistor Q6 is diode-connected). The transistor Q7 is connected between the node N2 and the first power supply terminal S1. A node connected to the gate of the transistor Q7 is defined as a "node N3". The node N2 is an output end of the pull-down driving circuit unit 21 and connected to the gate of the transistor Q2 in the output circuit unit 20 and the gate of a transistor Q5 in the pull-up driving circuit unit 22 described later.

An on-state resistance of the transistor Q7 is set sufficiently lower than that of the transistor Q6, and the transistors Q6 and Q7 constitute a ratio inverter using the node N3 as an input end and the node N2 as an output end. In the inverter, the transistor Q6 functions as a load element and the transistor Q7 functions as a driving element. The load element of the inverter has only to be a current driving element, and a resistance element or a constant current element, for example, may be used therefor instead of the transistor Q6. This also applies to the following preferred embodiment and variations.

The pull-down driving circuit unit 21 serves as a circuit for driving the transistors Q2 and Q5 in response to the level change of the node N3 in the normal operation. Specifically, in the normal operation, the pull-down driving circuit unit 21 turns the transistors Q2 and Q5 off during the selection period of the gate line $GL_k$ and turns these transistors on during the non-selection period. The pull-down driving circuit unit 21, however, serves as a circuit for initializing the level of the node N1 in the initial reset operation.

The pull-up driving circuit unit 22 is a circuit for driving the transistor Q1 (output pull-up transistor). Specifically, the pull-up driving circuit unit 22 turns the transistor Q1 on during the selection period of the gate line $GL_k$ and turns the transistor Q1 off during the non-selection period. The pull-up driving circuit unit 22 includes a transistor Q3 for charging the node N1 in response to activation of the signal inputted to the input terminal IN, a transistor Q4 for discharging the node N1 in response to activation of the signal inputted to the reset terminal RST, and a transistor Q5 for maintaining the node N1 at the L level during the non-selection period of the gate line $GL_k$.

The transistor Q3 has a gate connected to the input terminal IN and is connected between the input terminal IN and the node N1. The transistor Q4 has a gate connected to the reset terminal RST and is connected between the node N1 and the first power supply terminal S1. The transistor Q5 has a gate connected to the node N2 and is connected between the node N1 and the first power supply terminal S1. The drain of the transistor Q3 may be connected to the second power supply terminal S2.

The initial reset circuit unit 23 provided between the node N1 (the gate of the transistor Q1) and the node N3 (the gate of the transistor Q7) consists of three transistors Q8 to Q10 (unidirectional elements) which are diode-connected. The transistor Q8 is connected between the second power supply terminal S2 and the node N3 so that it has an anode on the side of the node N3 and a cathode on the side of the second power supply terminal S2. The transistor Q9 is connected between the node N1 and the node N3 so that it has an anode on the side of the node N3 and a cathode on the side of the node N1. The transistor Q10 is connected between the input terminal IN and the node N3 so that it has an anode on the side of the input terminal IN and a cathode on the side of the node N3. The transistor Q10 does not always need to be diode-connected but the drain thereof may be connected to the second power supply terminal S2.

Though described later in detail, the initial reset circuit unit 23 operates to cause the node N3 to have a voltage not higher than the threshold voltage Vth at power-on, and this initializes the respective levels of the nodes at power-on. In the normal operation, when the voltage of the node N1 is boosted with activation of the output signal U, the initial reset circuit unit 23 operates to separate the node N3 and the node N1 from each other, to thereby decrease the parasitic capacitance of the node N1. This prevents the range of boosting the voltage of the node N1 from decreasing.

Hereinafter, an operation of the unit shift register SR shown in FIG. 3 will be discussed. FIG. 4 is a signal waveform chart showing the operation. For simple discussion, it is assumed that the respective H-level potentials of the clock signals CLK and /CLK and the start pulse ST are all equal to the high-side power supply potential VDD. Further, it is assumed that the respective L-level potentials of the clock signals CLK and /CLK and the start pulse ST are all equal to the low-side power supply potential VSS, being 0V (VSS=0). The clock signals CLK and /CLK are repeating signals, having a phase difference of 1 horizontal period (1H) from each other. Though the initial reset operation is performed for all the unit shift registers SR, FIG. 4 representatively shows the signal waveforms of the nodes N1 to N3 of the unit shift register $SR_1$.

The time $t_0$ in FIG. 4 is the power-on of the gate line driving circuit 30. At that time, a high-side power supply and a low-side power supply are set to appropriate potentials, respectively. Specifically, the potential of the high-side power supply (the second power supply terminal S2) is set to VDD and the potential of the low-side power supply (the first power supply terminal S1) is set to VSS (herein, as VSS=0, the potential of the first power supply terminal S1 does not change at power-on). The power supply for the clock signal generator 31 and the start signal generator 32 is also turned on. Immediately after the time $t_0$, the levels of the output signals $G_1, G_2, \ldots$ of the gate line driving circuit 30 are in an unsteady state.

At this point of time, the level of the node N1 (the gate of the transistor Q1) in each unit shift register SR is also unsteady. If the nodes N1 are in the H level in a plurality of unit shift registers SR, since the transistors Q1 in these unit shift registers SR are turned on at the same time, when the clock signals CLK and /CLK are activated in the state, excessive current undesirably flows through the plurality of transistors Q1 of which the on-state resistances are low.

Herein, it is assumed that the node N1 in each unit shift register SR is in the H level.

Before the time $t_0$, since the power supply is cut off, the potential of the high-side power supply (the second power supply terminal S2) is at VSS level. If the potential of the node N3 is not lower than Vth at that time, the transistor Q8 is turned on, and the node N3 is discharged and the potential thereof falls to Vth. If the potential of the node N3 is not higher than Vth, the transistor Q8 is not turned on and the potential of the node N3 is maintained. In other words, the level of the node N3 is always not higher than Vth. Therefore, the transistor Q9 which is diode-connected so that the anode is on the side of the node N3 is in a reverse bias state and the H level of the node N1 is maintained.

When the power supply is turned on at the time $t_0$, the potential of the second power supply terminal S2 (high-side power supply) becomes VDD and the transistor Q6 is turned on. At that time, since the transistor Q8 is turned off, the potential of the gate (node N3) of the transistor Q7 is maintained at Vth or lower and only subthreshold current at most flows in the transistor Q7. In other words, the transistor Q7 is substantially in the OFF state and the node N2 is charged by the transistor Q6 until its potential becomes the H level (VDD-Vth). When the node N2 becomes the H level, since the transistor Q5 is turned on and discharges the node N1, the node N1 is initialized to the L level (VSS).

This initial reset operation is performed for all the unit shift registers of the gate line driving circuit 30. At that time, though the transistor Q8 is in the OFF state, since the potential of the node N1 becomes VSS, in turn, the transistor Q9 serves to maintain the potential of the node N3 at Vth or lower. In other words, when the potential of the node N3 becomes Vth or higher, the transistor Q9 is turned on and lowers the potential of the node N3 to Vth. When the potential of the node N3 is Vth or lower, the transistor Q8 is not turned on and the potential of the node N3 is maintained.

After the initial reset operation is finished, in each of all the unit shift registers SR, the node N1 is in the L level and the node N2 is in the H level (hereinafter, this state is referred to as a "reset state" of the unit shift register SR), and the transistor Q1 is in the OFF state and the transistor Q2 is in the ON state. Therefore, in each of all the unit shift registers SR, the output terminal OUT (the output signal G) is initialized to the L level with low impedance. Even if the clock signals CLK and /CLK are activated, since the transistors Q1 in all the unit shift registers SR are in the OFF state, no excessive current flows through the plurality of transistors Q1.

The reset state after initialization is maintained until the normal operation is started. This is because the transistors Q5, Q6, Q7, and Q9 constitute a half latch circuit to thereby retain the levels of the nodes N1, N2, and N3.

Thus, the gate line driving circuit 30 starts the normal operation as a shift register when the initial reset operation is finished for each unit shift register SR and the start pulse ST and the clock signals CLK and /CLK are activated. After the potential of the second power supply terminal S2 becomes VDD, the transistor Q8 is always in the OFF state and therefore does not contribute to the normal operation.

It is desirable that the normal operation should be started after the initial reset operation for each unit shift register SR is finished, in other words, after the time $t_1$ when the potential of the node N1 falls to VSS. In other words, as shown in FIG. 4, it is desirable that the start pulse ST and the clock signals CLK and /CLK should be maintained at the inactive level at least until the time $t_1$. It is thereby possible to more reliably prevent a malfunction of the unit shift registers SR which are in an unsteady state before the initial reset operation and current flow in the transistor Q1.

At the time $t_2$, when the start pulse ST becomes the H level (VDD), the transistor Q3 is turned on in the first-stage unit shift register $SR_1$. At that time, though the transistor Q5 is also in the ON state, an on-state resistance of the transistor Q3 is set sufficiently lower than that of the transistor Q5 and the node N1 becomes the H level (VDD-Vth). In response to that, the transistor Q1 is turned on, but at that time, since the clock signal CLK inputted to the clock terminal CK is in the inactive level (L level), the output signal $G_1$ to be outputted from the output terminal OUT is maintained at the L level (VSS).

When the start pulse ST becomes the H level, in the unit shift register $SR_1$, since the transistor Q10 is turned on, the node N3 is also charged to become the H level (VDD-Vth). In response to that, the transistor Q7 is turned on and the node N2 is discharged to becomes the L level. Therefore, the transistors Q2 and Q5 are turned off. Thus, the state where the node N1 is in the H level and the node N2 is in the L level, in other words, the state where the transistor Q1 is in the ON state and the transistor Q2 is in the OFF state is hereinafter referred to as a "set state" of the unit shift register SR.

After the unit shift register $SR_1$ is brought into the set state, at the time $t_3$, the start pulse ST becomes the L level. In the unit shift register $SR_1$, though the transistor Q3 is turned off, since the transistor Q5 is also in the OFF state, the node N1 is maintained at the H level in a high impedance state (floating state). At that time, since the transistor Q10 is also turned off, the node N3 is also maintained at the H level in the high impedance state. Therefore, the transistor Q7 is maintained ON and the node N2 is maintained at the L level. In other words, the unit shift register $SR_1$ is maintained in the set state.

At the time $t_4$, when the clock signal CLK is changed to the H level (VDD), in the unit shift register $SR_1$, the level change is transmitted to the output terminal OUT through the transistor Q1 in the ON state and the output signal $G_1$ is brought into the H level. When the level of the output signal $G_1$ rises, the voltage of the node N1 is boosted by coupling through the capacitive element C1 and the MOS capacitance of the transistor Q1. With the effect of boosting the voltage of the node N1, the transistor Q1 can operate in a non-saturated region. Therefore, the H-level potential of the output signal $G_1$ rises to VDD which is the same as the H level of the clock signal CLK. This brings the gate line $GL_1$ into a selected state.

Since the transistor Q9 which is diode-connected has an anode on the side of the node N3, the transistor Q9 serves as a unidirectional element to block discharge from the node N1 to the node N3. Therefore, even if the voltage of the node N1 is boosted, no electric charge is moved from the node N1 to the node N3 through the transistor Q9. Further, since the transistor Q9 separates the node N1 and the node N3 from each other, the gate capacitance of the transistor Q7 does not contribute to the parasitic capacitance of the node N1 and the parasitic capacitance of the node N1 thereby decreases. Therefore, the range of boosting the voltage of the node N1 increases at the activation of the output signal $G_1$. The on-state resistance of the transistor Q1 thereby falls and this prevents a decrease in the rising rate of the output signal $G_1$.

After that, at the time $t_5$, when the clock signal CLK is changed to the L level (VSS), the output terminal OUT is discharged through the transistor Q1 in the ON state and the output signal $G_1$ is brought into the L level (VSS).

Since the output signal $G_1$ is also inputted to the input terminal IN of the second-stage unit shift register $SR_2$, the unit shift register $SR_2$ is brought into the set state when the output signal $G_1$ becomes the H level at the time $t_3$. Therefore, at the time $t_6$, when the clock signal /CLK becomes the H level, the output signal $G_2$ of the second stage is brought into the H level. Since the output signal $G_2$ is inputted to the reset terminal RST of the unit shift register $SR_1$, in the unit shift register $SR_1$, the transistor Q4 is turned on and the node N1 is discharged to become the L level.

At that time, the transistor Q9 is turned on and the node N3 is discharged until its potential becomes Vth. Therefore, the transistor Q7 is substantially brought into the OFF state and the node N2 is charged by the transistor Q6 until its potential becomes the H level (VDD-Vth). In other words, the unit shift register $SR_1$ is in the reset state where the transistor Q1 is in the OFF state and the transistor Q2 is in the ON state.

After that, the unit shift register $SR_1$ is maintained in the reset state until the start pulse ST will become the H level in the next frame period. Also in this case, this is because the half latch circuit constituted of the transistors Q5, Q6, Q7, and Q9 retains the levels of the nodes N1, N2, and N3. During that period, since the transistor Q2 is in the ON state, the output terminal OUT is maintained at the L level with low impedance.

The operation of the first-stage unit shift register $SR_1$ in the gate line driving circuit 30 has been discussed above, and the second-stage and following unit shift registers SR also operate in the same manner. Specifically, the second-stage or following unit shift register SRk is brought into the set state in response to activation of the output signal $G_{k-1}$ of the preceding stage, activates the output signal $G_k$ thereof in response to activation of the clock signal inputted to the clock terminal CK at that time, and then is returned to the reset state in response to activation of the output signal $G_{k+1}$ of the subsequent stage, maintaining the output signal $G_k$ at the L level. In the configuration of FIG. 2, the last-stage unit shift register $SR_n$ is brought into the reset state by the start pulse ST of the next frame period.

Therefore, in the gate line driving circuit 30, with the activation of the start pulse ST inputted to the unit shift register $SR_1$ as a cue, in synchronization with the clock signals CLK and /CLK, the output signals $G_1$, $G_2$, $G_3$, . . . are sequentially activated. The gate line driving circuit 30 can thereby sequentially drive the gate lines $GL_1$, $GL_2$, $GL_3$, . . . in the predetermined scanning cycle.

Thus, in each of the unit shift registers SR of the first preferred embodiment, the initial reset circuit unit 23 maintains the potential of the node N3 at Vth or lower at power-on and the node N1 and the node N2 are thereby initialized to the L level and the H level, respectively. Therefore, even if the clock signals CLK and /CLK are activated before the normal operation is started, no excessive current flows through the plurality of transistors Q1. Further, this initial reset operation is performed in response to the power-on (the potential rise of the second power supply terminal S2) and no external initialization signal is needed. In other words, it is not necessary to provide a circuit for generating the initialization signal as an external circuit and this suppresses the rise of the manufacturing cost.

Further, when the potential of the node N1 is boosted in response to the activation of the output signal G, the transistor Q9 is turned off to thereby separate the node N1 and the node N3 from each other. Accordingly, the gate capacitance of the transistor Q7 does not contribute to the parasitic capacitance of the node N1 and the parasitic capacitance of the node N1 thereby decreases. Therefore, the range of boosting the voltage of the node N1 increases at the activation of the output signal G and this prevents a decrease in the rising rate of the output signal G.

The initialization of the node N1 is performed by turning the transistor Q5 on. The transistor Q5 is also provided in the background-art unit shift register SR in order to fix the node N1 to the inactive level during the non-selection period in the normal operation. In other words, no additional element is provided in the first preferred embodiment in order to initialize (inactivate) the node N1. Also from this point of view, the parasitic capacitance of the node N1 is suppressed to be low.

[The First Variation]

Figure 5:
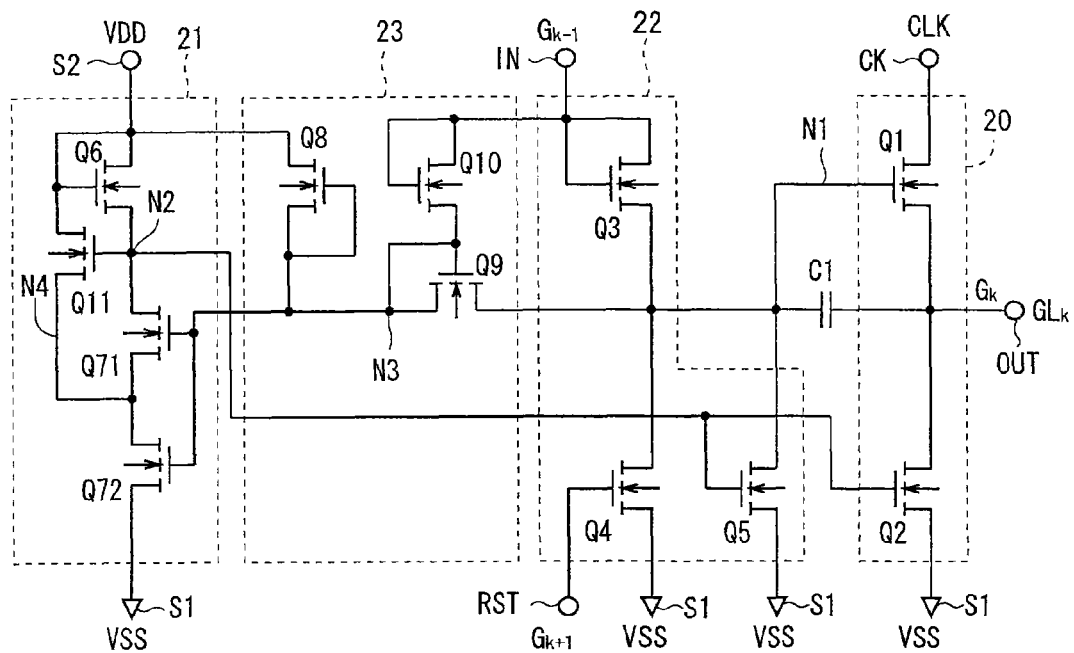
FIG. 5 is a circuit diagram showing a unit shift register in accordance with a first variation of the first preferred embodiment.

FIG. 5 is a circuit diagram showing a unit shift register in accordance with the first variation of the first preferred embodiment. The unit shift register SRk of the first variation uses a Schmitt trigger inverter constituted of the above-described transistor Q6 and transistors Q71, Q72, and Q11 as the pull-down driving circuit unit 21 in the circuit shown in FIG. 3.

As shown in FIG. 5, the transistor Q6 is connected between the second power supply terminal S2 and the node N2 and the gate thereof is connected to the second power supply terminal S2 (in other words, the transistor Q6 is diode-connected). The transistors Q71 and Q72 are connected in series between the node N2 (the gates of the transistors Q2 and Q5) serving as the output end of the pull-down driving circuit unit 21 and the first power supply terminal S1 and both the gates of these transistors are connected to the node N3. The transistor Q11 is connected between the second power supply terminal S2 and the connection node between the transistors Q71 and Q72 and the gate thereof is connected to the node N2.

In the Schmitt trigger inverter, feedback current flowing in the driving transistors (transistors Q71 and Q72) is changed in response to the change of the voltage of the output node (node N2) thereof, and the threshold voltage (reverse voltage) is thereby changed. As a result, the threshold voltage of this inverter becomes higher than the threshold voltage of the normal ratio inverter (the pull-down driving circuit unit 21 shown in FIG. 3). Therefore, even when the potential of the node N3 is Vth, the driving transistors (transistors Q71 and Q72) are sufficiently in the OFF state (not in the subthreshold state, unlike the transistor Q7 shown in FIG. 3). Therefore, as compared with the circuit shown in FIG. 3, the pull-down driving circuit unit 21 can set the node N2 to the H level more stably.

[The Second Variation]

Figure 6:
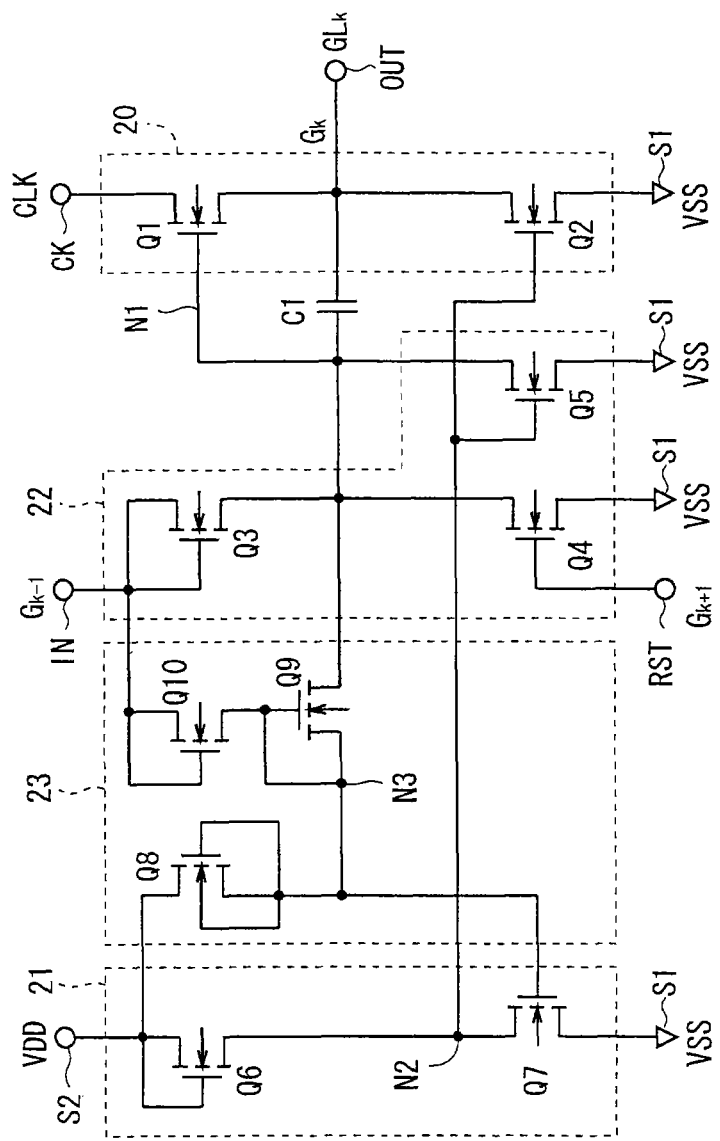
FIG. 6 is a circuit diagram showing a unit shift register in accordance with a second variation of the first preferred embodiment.

FIG. 6 is a circuit diagram showing a unit shift register in accordance with the second variation of the first preferred embodiment. In the unit shift register SRk of the second variation, the back gate of the transistor Q8 in the circuit shown in FIG. 3 is connected to the gate (node N3) thereof.

When the potential of the second power supply terminal S2 becomes VSS (=0V) at power-off, from the potential relation, the transistor Q8 has a source on the side of the second power supply terminal S2 and a drain on the side of the node N3. If the voltage between the back gate and the source of the transistor Q8 is Vth, since the back gate of the transistor Q8 is positively biased with respect to the source thereof, the threshold voltage of the transistor Q8 decreases to be smaller than Vth. For this reason, after power-off, the level of the node N3 becomes Vth or lower.

Accordingly, the gate potential of the transistor Q7 becomes Vth or lower at the next power-on, and the transistor Q7 is reliably in the OFF state. Therefore, in the initial reset operation, the node N2 can be set to the H level more reliably.

Since the potential of the second power supply terminal S2 is VDD in the normal operation, from the potential relation, the transistor Q8 has a source on the side of the node N3 and a drain on the side of the second power supply terminal S2. At that time, since the back gate of the transistor Q8 has the same potential as the source thereof, the threshold voltage of thereof becomes a given positive voltage and the transistor Q8 is maintained at the OFF state. Therefore, no effect is produced on the operation of the unit shift register SR.

Also in the second variation, by applying the first variation thereto, the Schmitt trigger inverter may be used, instead of the inverter constituted of the transistors Q6 and Q7 in the pull-down driving circuit unit 21.

[The Third Variation]

FIG. 7 is a circuit diagram showing a unit shift register SRk in accordance with the third variation of the first preferred embodiment. The unit shift register SRk of the third variation is also constituted of the output circuit unit 20, the pull-down driving circuit unit 21, the pull-up driving circuit unit 22, and the initial reset circuit unit 23, like the circuit shown in FIG. 3, but the configuration thereof other than the output circuit unit 20 is different from that of FIG. 3.

In the pull-down driving circuit unit 21, the ratio inverter constituted of the transistor Q6 and Q7 is provided like in the circuit of FIG. 3 and an input circuit for supplying the node N3 (the gate of the transistor Q7) serving as an input end of the ratio inverter with an appropriate signal is additionally provided. The input circuit consists of transistors Q15 to Q17.

The transistor Q15 having a gate connected to the input terminal IN is connected between the second power supply terminal S2 and the node N3. The transistors Q16 and Q17 are both connected between the node N3 and the first power supply terminal S1, and the gate of the transistor Q16 is connected to the reset terminal RST and the gate of the transistor Q17 is connected to the node N2.

An on-state resistance of the transistor Q15 is set sufficiently lower than that of the transistor Q17. Accordingly, in the normal operation, when the transistor Q15 is turned on in response to the activation of the output signal $G_{k-1}$ of the preceding stage, the node N3 is charged to the H level. The transistor Q16 discharges the node N3 to be changed to the L level in response to the activation of the output signal $G_{k+1}$ of the subsequent stage. Therefore, the pull-down driving circuit unit 21 in the normal operation serves to bring the node N2 into the L level in response to the activation of the output signal G$_{k-1}$ of the preceding stage and into the H level in response to the activation of the output signal G$_{k+1}$ of the subsequent stage.

The initial reset circuit unit 23 includes only the transistor Q8 which is connected between the second power supply terminal S2 and the node N3 and the gate thereof is connected to the node N3. When the power supply is cut off and the potential of the second power supply terminal S2 is VSS, the transistor Q8 maintains the potential of the node N3 at Vth or lower. After the power supply is turned on and the potential of the second power supply terminal S2 becomes VDD, the transistor Q8 is always in the OFF state and does not contribute to the normal operation of the unit shift register SR.

On the other hand, the pull-up driving circuit unit 22 consists of the Q3 connected between the input terminal IN and the node N1 (the gate of the transistor Q1) and a transistor Q14 connected between the gate of the transistor Q3 and the node N2. The gate of the transistor Q14 is connected to the second power supply terminal S2. Herein, a node connected to the gate of the transistor Q3 is defined as a "node N6".

Hereinafter, an initial reset operation performed at the power-on of the unit shift register SR shown in FIG. 7 will be discussed.

In the unit shift register SR, before power-on, i.e., when the potential of the second power supply terminal S2 is VSS, the potential of the node N3 is maintained at Vth or lower by the operation of the transistor Q8 of the initial reset circuit unit 23. At that time, the potential of the output terminal OUT of the unit shift register SR is unsteady.

When the power supply is turned on, the potential of the second power supply terminal S2 becomes VDD, and the potential of the node N3 is maintained at Vth or lower since the transistor Q8 is diode-connected so that its anode is provided on the side of the node N3. Accordingly, the transistor Q7 is in the OFF state (or in the subthreshold state) and the node N2 is charged by the transistor Q6 to be initialized to the H level (VDD-Vth). In response to that, the transistor Q2 is turned on and the output terminal OUT is brought into the L level (VS) with low impedance. Further, at that time, since the transistor Q17 is turned on, the potential of the node N3 becomes the L level of VSS.

At power-on, since the transistor Q14 of the pull-up driving circuit unit 22 is turned on, when the node N4 is brought into the H level, the node N6 is also brought into the H level (VDD-Vth). In response to that, the transistor Q3 is turned on. Since the input terminal IN in each unit shift register SR is connected to the output terminal OUT of the preceding stage and the output terminal OUT in each unit shift register SR is initialized to the L level (VSS) as discussed above (the start pulse ST is in the L level in the first-stage unit shift register SR$_1$), when the transistor Q3 is turned on, the node N1 is initialized to the L level (VSS). Accordingly, the transistor Q1 is brought into the OFF state.

Thus, by performing the initial reset operation, each of all the unit shift registers SR is brought into the reset state where the node N1 is in the L level and the node N2 is in the H level, and the transistor Q1 is turned off and the transistor Q2 is turned on. Accordingly, the output signal G in each of all the unit shift registers SR get out of the unsteady state to be brought into the L level. At that time, even if the clock signals CLK and /CLK are activated, since the transistors Q1 in all the unit shift registers SR are in the OFF state, no excessive current flows through the plurality of transistors Q1.

This reset state is maintained until the normal operation is started. This is because the transistors Q6, Q7, and Q17 constitute a half latch circuit to thereby retain the levels of the nodes N1, N2, and N3.

Next, a normal operation of the unit shift register SR shown in FIG. 7 will be discussed. Herein, an operation of the unit shift register SRk of the k-th stage will be representatively discussed. It is assumed that the clock signal CLK is inputted to the clock terminal CK of the unit shift register SRk (odd-number stages in the gate line driving circuit 30 correspond to this case).

It is assumed that in the unit shift register SRk of the reset state, the output signal G$_{k-1}$ of the preceding stage is activated (the start pulse ST is activated in the case of the first-stage unit shift register SR$_1$). Since the transistor Q3 in the pull-up driving circuit unit 22 is in the ON state, the level of the node N1 rises.

At that time, between the input terminal IN and the node N6 and between the node N1 and the node N6, there is capacitive coupling by the parasitic capacitance of the transistor Q3 (the gate-channel capacitance, gate-drain overlap capacitance, gate-source overlap capacitance, or the like) and the level of the node N6 rises in response to the level rise of the input terminal 1N and the node N1. The potential of the node N6 becomes higher than the amplitude (VDD) of the output signal G$_{k-1}$ of the preceding stage and when the potential of the node N6 becomes not lower than VDD+Vth, the transistor Q3 operates in the non-saturated region. As a result, the node N1 is quickly charged (precharged) to be brought into the H level with the potential VDD. In response to that, the transistor Q1 is turned on.

On the other hand, in the pull-down driving circuit unit 21, in response to the rise of the output signal G$_{k-1}$ of the preceding stage, the transistor Q15 is turned on and the level of the node N3 rises. In response to that, the transistor Q7 is turned on and the level of the node N2 starts falling. When the level of the node N2 falls, the transistor Q14 is turned on, to thereby carry current in the direction from node N6 toward the node N2. Accordingly, the level of the node N6 falls in response to the fall of the level of the node N2.

When the nodes N2 and N6 become the L level, the transistor Q2 in the output circuit unit 20 is turned off. In other words, the unit shift register SRk is brought into the set state where the where the transistor Q1 is in the ON state and the transistor Q2 is in the OFF state. At this point of time, since the clock signal CLK is in the L level, the output terminal OUT (output signal G$_k$) is maintained at the L level with low impedance. Further, since the transistor Q3 is turned off, the node N1 is maintained at the H level in the floating state.

In the pull-down driving circuit unit 21, when the node N2 becomes the L level, the transistor Q17 is turned off. As a result, the node N3 is brought into the H level with the potential VDD-Vth.

Herein, attention is directed to an operation of the transistor Q14 while the node N1 is precharged. Before the node N1 is precharged, since the node N2 is in the H level (VDD-Vth) and the gate potential of the transistor Q14 is fixed to VDD, the transistor Q14 carries current from the node N2 to the node N6, to thereby charge the node N6 to the H level (VDD-Vth).

When the output signal G$_{k-1}$ of the preceding stage rises and the transistor Q3 starts precharging of the node N1, since the voltage of the node N6 is boosted, from the potential relation, the transistor Q14 has a source on the side of the node N2. At this point of time, since the potential of the node N2 is VDD-Vth, the voltage between the gate (the second power supply terminal S2) of the transistor Q14 and the source (the node N2) thereof becomes Vth and the transistor Q14 is substantially brought into the OFF state (subthreshold state). Accordingly, subthreshold current flows in the transistor Q14 in the direction from the node N6 toward the node N2, but since this current is very small, the electric charges discharged from the node N6 during a short period while the voltage of the node N6 is boosted are negligible.

After the node N1 is precharged to be the H level (VDD), when the node N2 is brought into the L level, the transistor Q14 is turned on, current flows in the direction from the node N6 toward the node N2, and the node N6 is brought into the L level (VSS). After that, while the node N2 is in the L level, the transistor Q14 is maintained at the ON level and the node N6 is maintained at the L level.

Thus, the transistor Q14 serves as a resistance element for transmitting the potential of the node N2 to the Node N6 in the stage where the node N2 is in the H level before the precharge of the node N1, and serves as an interrupting element for interrupting the transmission between the node N6 and the node N2 in the stage where the voltage of the node N6 is boosted at the start of precharge of the node N1. Further, in the stage where the precharge of the node N1 proceeds and the level of the node N2 falls and in the following stage where the node N2 is maintained at the L level, the transistor Q14 serves as a resistance element for discharging the electric charges of the node N6 to the node N2. In other words, the transistor Q14 functions as a charge/discharge circuit for charging the node N6 before the activation of the output signal $G_{k-1}$ of the preceding stage and for discharging the node N6 before the inactivation of the output signal $G_{k-1}$ of the preceding stage.

After the precharge of the node N1 is completed in the unit shift register SRk, the output signal $G_{k-1}$ of the preceding stage is returned to the L level. At that time, since the transistor Q3 in the pull-up driving circuit unit 22 has been already in the OFF state, the level of the node N1 is not changed. The transistor Q15 in the pull-down driving circuit unit 21 is turned off.

After that, when the clock signal CLK rises, the level change is transmitted to the output terminal OUT through the transistor Q1 in the ON state and the level of the output signal $G_k$ thereby rises. At that time, the voltage of the node N1 is boosted by coupling through the capacitive element C1, to thereby cause the transistor Q1 to operate in the non-saturated region. Therefore, the output signal $G_k$ is brought into the H level with the potential VDD like in the H level of the clock signal CLK.

When the clock signal CLK falls, current flows from the output terminal OUT to the clock terminal CK through the transistor Q1 in the ON state, to thereby discharge the output terminal OUT. As a result, the output signal $G_k$ is returned to the L level. At that time, the node N1 is returned to the level (VDD) before being boosted by coupling through the capacitive element C1.

In this case, since the output signal $G_k$ is also inputted to the input terminal IN of the unit shift register $SR_{k+1}$ of the subsequent stage, when the output signal $G_k$ becomes the H level, the unit shift register $SR_{k+1}$ of the subsequent stage is changed to the set state.

For this reason, when the next clock signal /CLK rises, the output signal $G_{k+1}$ of the subsequent stage is brought into the H level. Accordingly, in the unit shift register $SR_k$, the transistor Q16 is turned on and the node N3 becomes the L level. In response to that, since the transistor Q7 is turned off, the node N2 is charged by the transistor Q6 to the H level.

When the node N2 becomes the H level, current flows from the node N2 to the node N6 through the transistor Q14 in the ON state and the node N6 is thereby brought into the H level with the potential VDD-Vth. As a result, the transistor Q3 is turned on and the node N1 is discharged to be brought into the L level with low impedance. Consequently, the unit shift register SRk is returned to the reset state where the transistor Q1 is in the OFF state and the transistor Q2 is in the ON state.

After that, the output signal $G_{k+1}$ of the subsequent stage is returned to the L level but the unit shift register SRk is maintained in the reset state until the output signal $G_{k-1}$ of the preceding stage is activated in the next frame period. This is because the half latch circuit constituted of the transistors Q6, Q7, and Q17 retains the levels of the nodes N2, and N3. Further, during the period, since the transistor Q2 is in the ON state, the output terminal OUT is maintained at the L level with low impedance.

In the unit shift register SR of the third variation, the parasitic capacitance of the transistor Q3 functions as a booster for the node N6 and this raises the gate potential of the transistor Q3 at the precharge of the node N1. Since the transistor Q3 thereby operates in the non-saturated region, the level rise rate of the node N1 becomes higher than the conventional one. Therefore, even if the frequency of the clock signal becomes high and the pulse width of the signal inputted to the input terminal IN becomes narrow, the node N1 can be sufficiently precharged. This produces an effect of preventing a decrease in the driving capability of the transistor Q1.

As can be seen from the above-discussed operation, in the unit shift register SR of FIG. 7, the transistor Q3 performs both the charging (precharging) of the node N1 in order to bring the unit shift register SRk into the set state and the discharging of the node N1 in order to bring the unit shift register SRk into the reset state. In other words, the transistor Q3 performs both the functions of the transistors Q3 and Q5 shown in FIG. 3.

Further, in the unit shift register SR of FIG. 7, the node N1 (the gate of the transistor Q1) and the node N3 (the gate of the transistor Q7) are separated from each other and the discharge of the node N3 can be performed by the transistor Q16 in the pull-down driving circuit unit 21. Therefore, in the initial reset circuit unit 23, no element which corresponds to the transistor Q9 shown in FIG. 3 needs to be provided. The number of transistors connected to the node N1 is thereby reduced and the parasitic capacitance of the node N1 further decreases as compared with that in FIG. 3.

In the unit shift register SR of FIG. 7, the node N3 is charged by the transistor Q15 in the pull-down driving circuit unit 21. The transistor Q15 has the same function as that of the transistor Q10 shown in FIG. 3.

Also in the third variation, by applying the first variation thereto, the Schmitt trigger inverter may be used, instead of the inverter constituted of the transistors Q6 and Q7 in the pull-down driving circuit unit 21. Alternatively, by applying the second variation thereto, the back gate of the transistor Q8 in the initial reset circuit unit 23 may be connected to the node N3.

[The Fourth Variation]

In the fourth variation, the initial reset circuit unit 23 of the first preferred embodiment is applied to the unit shift register SR disclosed in Japanese Patent Application Laid Open Gazette No. 2007-257813 which is invented by the inventor of the present invention.

Figure 8:
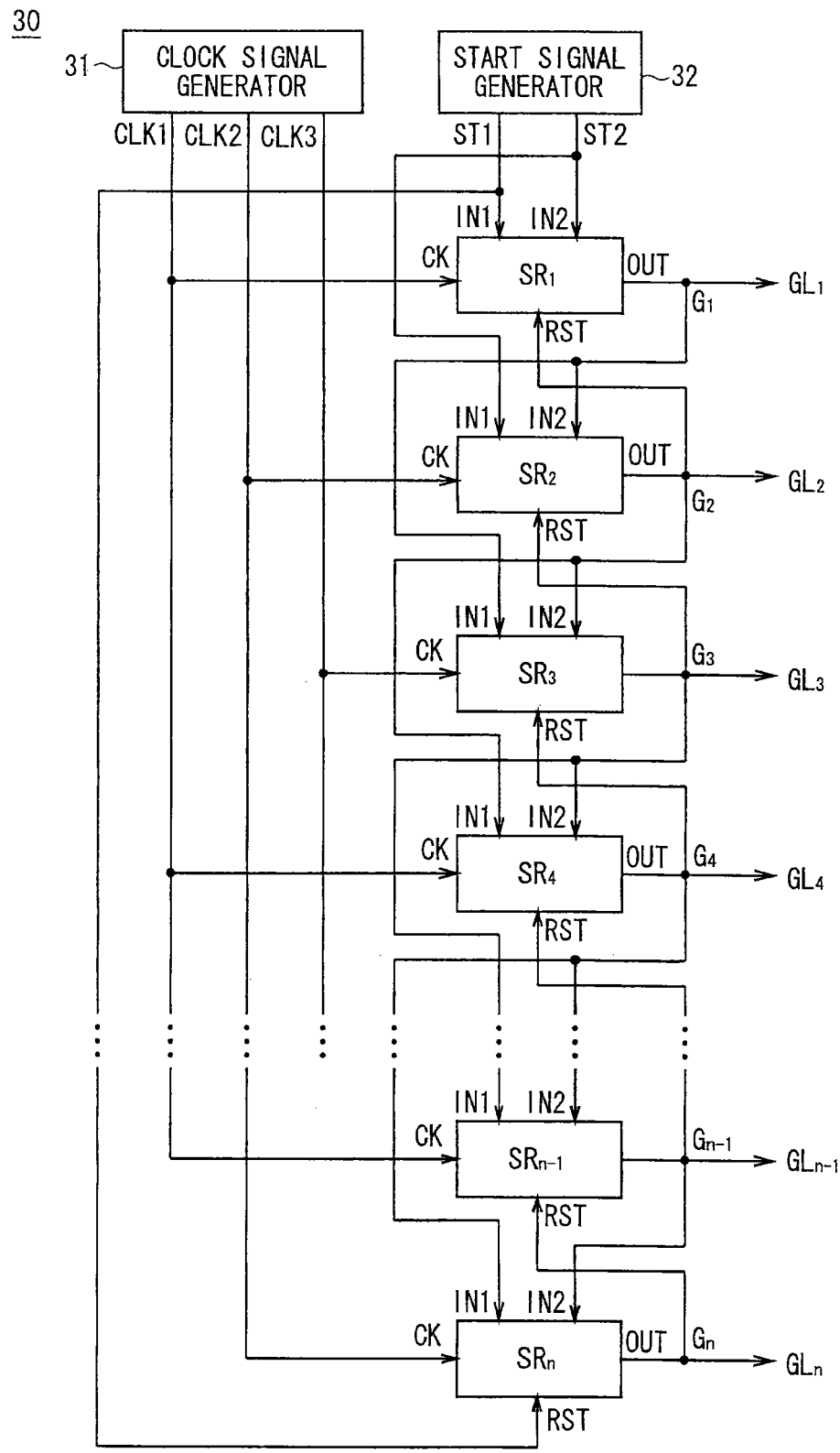
FIG. 8 is a schematic block diagram showing a gate line driving circuit in accordance with a fourth variation of the first preferred embodiment.

FIG. 8 is a schematic block diagram showing a gate line driving circuit 30 in accordance with the fourth variation of the first preferred embodiment. As shown in FIG. 8, a clock signal generator 31 of the fourth variation generates three clock signals CLK1, CLK2, and CLK3 of which the phases are different (the respective active periods do not overlap one another). The respective phases of these clock signals are shifted by 1 horizontal scanning period (1H) and activated in the order of CLK1, CLK2, CLK3, CLK1, CLK2, ... repeatedly.

A start signal generator 32 of the fourth variation outputs first and second start pulses ST1 and ST2. The first and second start pulses ST1 and ST2 are both brought into the H level at a timing corresponding to the beginning of each frame period of an image signal, but the respective phases of these start pulses are shifted by 1 horizontal scanning period (1H) and the respective active periods do not overlap each other. The first start pulse ST1 is activated ahead of the second start pulse ST2 and the second start pulse ST2 is activated after 1 horizontal scanning period elapses (after the first start pulse ST1 is inactivated).

As shown in FIG. 8, each unit shift register SR has the clock terminal CK, the reset terminal RST, the output terminal OUT, a first input terminal IN1 and a second input terminal IN2. The clock terminal CK in each unit shift register SR is supplied with a predetermined one of the clock signals CLK1, CLK2, and CLK3. In this exemplary case, the clock signal CLK1 is supplied to the unit shift registers $SR_1$, $SR_4$, $SR_7$, ... of the (3m-2)-th stages, the clock signal CLK2 is supplied to the unit shift registers $SR_2$, $SR_5$, $SR_8$, ... of the (3m-1)-th stages, and the clock signal CLK3 is supplied to the unit shift registers $SR_3$, $SR_6$, $SR_9$, ... of the (3m)-th stages.

In the first-stage unit shift register $SR_1$, the first start pulse ST1 is inputted to the first input terminal IN1 and the second start pulse ST2 is inputted to the second input terminal IN2. In the second-stage unit shift register $SR_2$, the second start pulse ST2 is inputted to the first input terminal IN1 and the output signal G of the first-stage unit shift register $SR_1$ is inputted to the second input terminal IN2. In the third-stage or following unit shift register SRk, the output signal $G_{k-1}$ of the preceding stage (the unit shift register $SR_{k-1}$) is inputted to the first input terminal IN1 and the output signal $G_{k-2}$ of the stage precedent to the preceding stage (the unit shift register $SR_{k-2}$) is inputted to the second input terminal IN2.

To the reset terminal RST in each unit shift register SR, the output signal $G_{k+1}$ of the unit shift register $SR_{k+1}$ of the subsequent stage is inputted. In the exemplary case of FIG. 8, however, the first start pulse ST1 is inputted to the reset terminal RST of the last-stage unit shift register $SR_n$.

Figure 9:
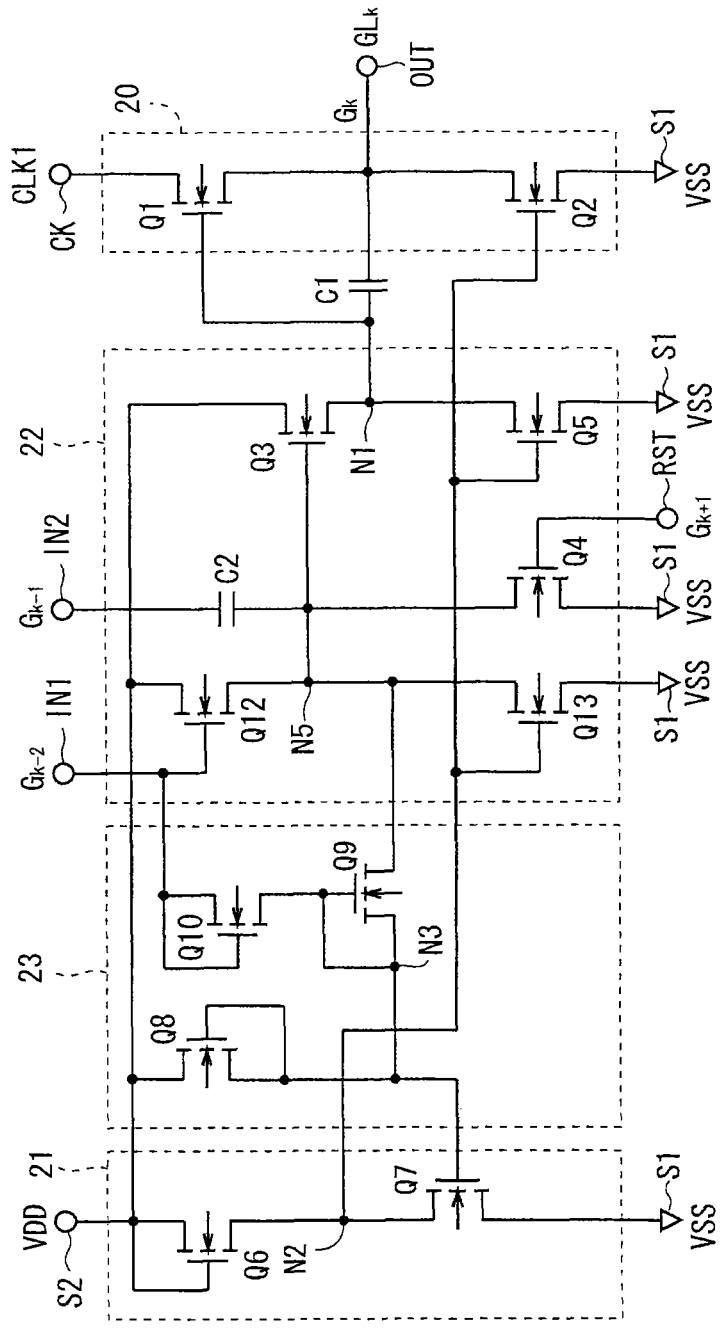
FIGS. 9 and 10 are circuit diagrams each showing a unit shift register in accordance with the fourth variation of the first preferred embodiment.

FIG. 9 is a circuit diagram showing the unit shift register SR in accordance with the fourth variation. Herein, the unit shift register $SR_k$ of the k-th stage is representatively shown. The unit shift register $SR_k$ of FIG. 9 is different from that of FIG. 3 in the configuration of the pull-up driving circuit unit 22. With the difference, in the initial reset circuit unit 23, the transistor Q9 is separated from the node N1 and the drain of the transistor Q10 is connected to the first input terminal IN1.

The pull-up driving circuit unit 22 of the unit shift register SR is constituted of the above-described transistors Q3 to Q5, transistors Q12 and Q13, and a capacitive element C2. The transistor Q3 is connected between the node N1 (the gate of the transistor Q1) and the second power supply terminal S2. When a node connected to the gate of the transistor Q3 is defined as a "node N5", the transistor Q4 is connected between the node N5 and the first power supply terminal S1 and the gate thereof is connected to the reset terminal RST. The transistor Q5 is connected between the node N1 and the first power supply terminal S1 and the gate thereof is connected to the node N2 (the output end of the pull-down driving circuit unit 21).

The transistor Q12 is connected between the second power supply terminal S2 and the node N5 and the gate thereof is connected to the first input terminal IN1. The transistor Q13 is connected between the node N5 and the first power supply terminal S1 and the gate thereof is connected to the node N2. The capacitive element C2 is connected between the second input terminal 1N2 and the node N5.

The initial reset circuit unit 23 of the fourth variation has the same configuration as that of the initial reset circuit unit 23 shown in FIG. 3 but in accordance with the change of the configuration of the pull-up driving circuit unit 22, the respective connections of the transistors Q9 and Q10 are changed. The transistor Q9 is connected between the node N3 (the input end of the pull-down driving circuit unit 21) and the node N5. The transistor Q10 is connected between the first input terminal IN1 and the node N3.

Hereinafter, an operation of the unit shift register SR of the fourth variation will be discussed. For simple discussion, it is assumed that the respective H-level potentials of the clock signals CLK1, CLK2, and CLK3, and the first and second start pulses ST1 and ST2 are all equal to the high-side power supply potential VDD and the respective L-level potentials thereof are all equal to the low-side power supply potential VSS.

First, an initial reset operation performed at the power-on of the unit shift register SR will be discussed.

In each unit shift register SR, before the power supply is turned on, i.e., when the potential of the second power supply terminal S2 is VSS, the potential of the node N3 is maintained at Vth or lower by the operation of the transistor Q8 in the initial reset circuit unit 23. At that time, since the potential of the output terminal OUT in each unit shift register SR is unsteady, the respective potentials of the nodes N1, N2, and N5 are also in the unsteady state.

When the power supply is turned on and the potential of the second power supply terminal S2 becomes VDD, the transistor Q6 is turned on. Since the potential of the node N3 is Vth or lower, the transistor Q7 is in the OFF state (or subthreshold state) and the node N2 is charged to the H level (VDD-Vth). In response to that, the transistors Q5 and Q13 are turned on and the nodes N1 and N5 are both initialized to the L level (VSS). Though the transistor Q8 is in the OFF state, however, since the potential of the node N5 becomes VSS, the transistor Q9, in turn, serves to maintain the potential of the node N3 at Vth or lower.

After the initial reset operation is finished, each of all the unit shift registers SR is brought into the reset state where the node N1 is in the L level and the node N2 is in the H level, and the transistor Q1 is turned off and the transistor Q2 is turned on. Accordingly, the output terminal OUT (the output signal G) in each of all the unit shift registers SR is initialized to the L level with low impedance. At that time, even if the clock signals CLK1 to CLK3 are activated, since the transistors Q1 in all the unit shift registers SR are in the OFF state, no excessive current flows through the plurality of transistors Q1.

This reset state after the initialization is maintained until the normal operation is started. This is because the transistors Q6, Q7, Q9, and Q13 constitute a half latch circuit to thereby retain the levels of the nodes N2, and N3.

Next, a normal operation of the unit shift register SR shown in FIG. 9 will be discussed. Herein, an operation of the unit shift register SRk of the k-th stage will be representatively discussed. It is assumed that the clock signal CLK1 is inputted to the clock terminal CK of the unit shift register SRk (for example, the unit shift registers $SR_1$, $SR_4$, or the like corresponds to this case).

In the unit shift register SRk of the reset state, when the output signal $G_{k-2}$ of the stage precedent to the preceding stage (the first start pulse ST1 in the case of the first-stage unit shift register $SR_1$) is brought into the H level, the transistor Q12 in the pull-up driving circuit unit 22 is turned on. At that time, though the transistor Q13 is also in the ON state, an on-state resistance of the transistor Q12 is set sufficiently lower than that of the transistor Q13 and the level of the node N5 rises. In other words, the transistor Q12 functions as a charging circuit for charging the node N5 in response to activation of the signal inputted to the first input terminal IN1.

On the other hand, in the initial reset circuit unit 23, the transistor Q10 is turned on and the node N3 is brought into the H level. In response to that, the transistor Q7 in the pull-down driving circuit unit 21 is turned on and the node N2 is discharged to the L level. Then, since the transistor Q13 is turned off, the H-level potential of the node N5 becomes sufficiently high. Further, at that time, the transistors Q2 and Q5 are also turned off.

Though the transistor Q12 operates in the source follower mode to charge the node N5, since the capacitance component of the node N5 (mainly, the gate capacitance of the transistor Q3 and the capacitive element C2) is sufficiently smaller than that of the node N1 (mainly, the gate capacitance of the transistor Q1 and the capacitive element C1), the node N5 is quickly charged and the H-level potential thereof becomes almost a theoretical value (VDD-Vth). This is because the transistor Q3 does not need to have large gate width while the transistor Q1 needs to have larger gate width in order to charge the gate line $GL_k$ which is a large capacitance load.

When the node N5 becomes the H level, the transistor Q3 is turned on and starts the charging of the node N1. Since the node N1 has a large capacitance component as mentioned above and the transistor Q3 operates in the source follower mode, the level rise rate of the node N1 is not relatively high. Therefore, when the frequencies of the clock signals CLK1 to CLK3 are high and the active period (pulse width) of the output signal $G_{k-2}$ of the stage precedent to the preceding stage is short, the potential of the node N1 does not reach the theoretical value (VDD-2×Vth) during the period.

When the output signal $G_{k-2}$ of the stage precedent to the preceding stage is returned to the L level, since the transistors Q10 and Q12 are turned off, the nodes N3 and N5 are maintained at the H level in the floating state.

Subsequently, when the output signal $G_{k-1}$ of the preceding stage (the second start pulse ST2 in the case of the first-stage unit shift register $SR_1$) is brought into the H level, the voltage of the node N5 is boosted by coupling through the capacitive element C2 in the unit shift register $SR_k$. In other words, the capacitive element C2 functions as a boosting circuit for boosting the voltage of the node N5 in response to the activation of the signal of the second input terminal IN2.

The potential of the node N5 after being boosted by the capacitive element C2 rises by the amplitude (VDD) of the output signal $G_{k-1}$ of the preceding stage as compared with the potential before being boosted. In other words, the potential of the node N5 after being boosted becomes about 2×VDD-Vth. In this state, the transistor Q3 operates in the non-saturated region, not in the source follower mode, to charge the node N1. Therefore, since the charge rate of the node N1 increases and no loss of the threshold voltage Vth occurs, the node N1 is brought into the H level with the potential VDD.

Thus, the unit shift register SRk is brought into the state (set state) where the node N1 is in the H level and the node N2 is in the L level, and the transistor Q1 is turned on and the transistor Q2 is turned off. At this point of time, however, since the clock signal CLK1 is in the L level, the output signal $G_k$ is not changed from the L level.

After that, when the output signal $G_{k-1}$ of the preceding stage is returned to the L level, the potential of the node N5 is lowered by the coupling through the capacitive element C2 and returned to the potential (about VDD-Vth) before being boosted. At that time, though the transistor Q3 is turned off, the node N1 is maintained at the H level (VDD) in the floating state. Therefore, the set state of the unit shift register SRk is maintained.

Subsequently, when the clock signal CLK1 becomes the H level, the output terminal OUT is charged through the transistor Q1 in the ON state and the output signal $G_k$ is thereby brought into the H level. At that time, the voltage of the node N1 is boosted by coupling through the capacitive element C1 and the gate-channel capacitance of the transistor Q1. As a result, since the transistor Q1 operates in the non-saturated region, the potential of the H level of the output signal $G_k$ becomes VDD which is the same as that of the H level of the clock signal CLK1.

When the clock signal CLK1 is returned to the L level, the output terminal OUT is discharged through the transistor Q1 in the ON state and the output signal $G_k$ is thereby returned to the L level (VSS). At that time, the potential of the node N1 also falls to VDD before being boosted.

After that, when the output signal $G_{k+1}$ of the subsequent stage becomes the H level, the transistor Q4 is turned on and the node N5 is discharged to the L level (VSS). At that time, since the transistor Q9 is turned on, both the nodes N3 and N5 are discharged. As a result, since the potential of the node N3 becomes Vth and the transistor Q7 is substantially brought into the OFF state (subthreshold state), the node N2 is brought into the H level. In response to that, the transistors Q5 and Q15 are turned on and the node N1 becomes the L level. As a result, the unit shift register SRk is returned to the reset state where the transistor Q1 is in the OFF state and the transistor Q2 is in the ON state and the output signal $G_k$ is brought into the L level with low impedance.

Also after the output signal $G_{k+1}$ of the subsequent stage is returned to the L level, since the transistors Q5 and Q13 are maintained at the ON state, the nodes N1 and N5 are maintained at the L level. Therefore, the reset state of the unit shift register SRk continues until the output signal $G_{k-2}$ of the stage precedent to the preceding stage is activated again in the next frame period.

In the unit shift register SRk of the fourth variation, since the transistor Q12 (charging circuit) charges the node N5 and subsequently the capacitive element C2 (boosting circuit) boosts the voltage of the node N5, the transistor Q3 operates in the non-saturated region to charge (precharge) the node N1. For this reason, it is possible to charge the node N1 quickly and up to high potential. Therefore, even if the frequency of the clock signals CLK1 to CLK3 are high, it is possible to sufficiently precharge the node N1 and prevent the on-state resistance of the transistor Q1 from rising. This achieves high-speed operation of the gate line driving circuit 30.

Further, in the unit shift register SRk of FIG. 9, when the voltage of the node N5 is boosted in response to the activation of the output signal $G_{k-1}$ of the preceding stage, the transistor Q9 is turned off to thereby separate the node N5 and the node N3 from each other. Therefore, since the gate capacitance of the transistor Q7 does not contribute to the parasitic capacitance of the node N5 at that time, it is possible to reduce the parasitic capacitance of the node N5 in the unit shift register disclosed in Japanese Patent Application Laid Open Gazette No. 2007-257813.

Figure 10:
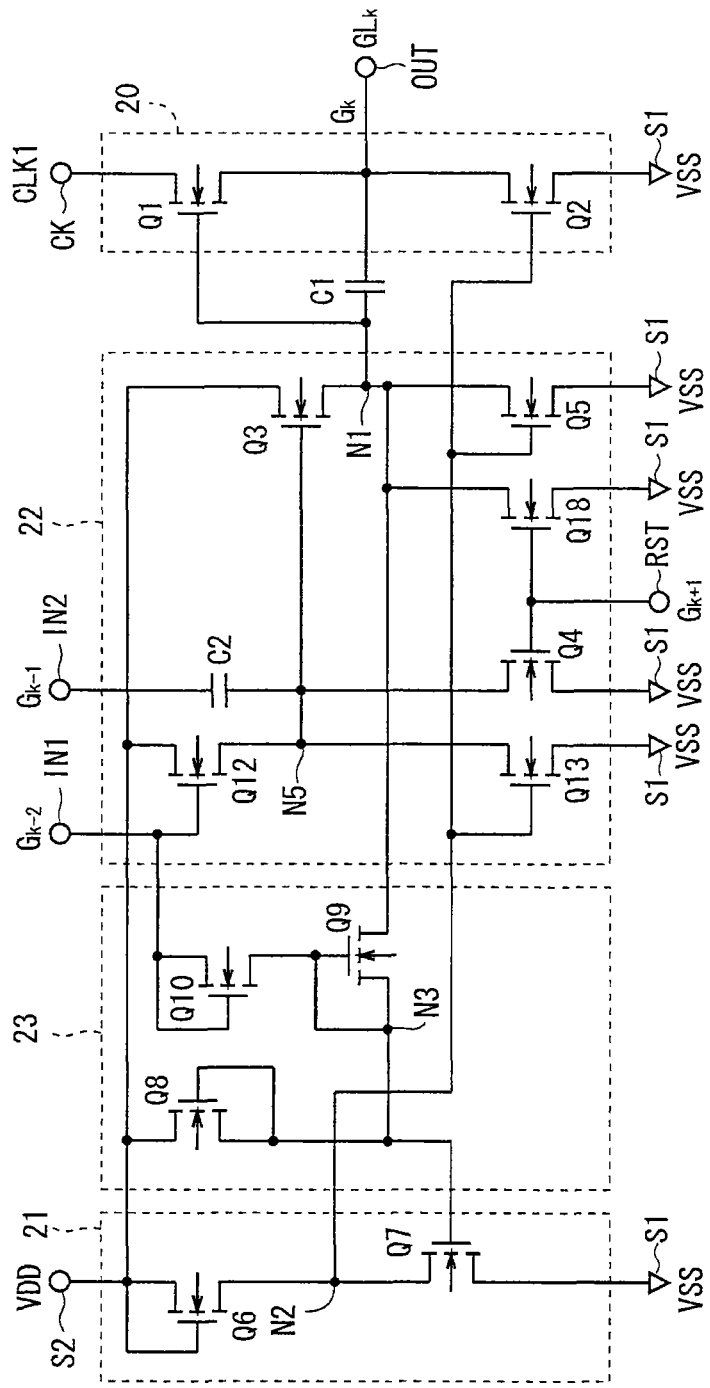

Though the cathode of the diode-connected transistor Q9 is connected to the node N5 in the circuit of FIG. 9, the cathode thereof may be connected to the node N1 as shown in FIG. 10. In this case, it is necessary to provide a transistor Q18 which has a gate connected to the reset terminal RST and serves to discharge the node N1 so that the unit shift register SRk is brought into the reset state in response to the activation of the output signal $G_{k+1}$ of the subsequent stage. In the configuration of FIG. 10, the transistor Q9 serves to separate the node N1 and the node N3 to thereby reduce the parasitic capacitance of the node N1 when the voltage of the node N1 is boosted.

Also in the fourth variation, by applying the first variation thereto, the Schmitt trigger inverter may be used, instead of the inverter constituted of the transistors Q6 and Q7 in the pull-down driving circuit unit 21. Alternatively, by applying the second variation thereto, the back gate of the transistor Q8 in the initial reset circuit unit 23 may be connected to the node N3.

<The Second Preferred Embodiment>

Figure 11:
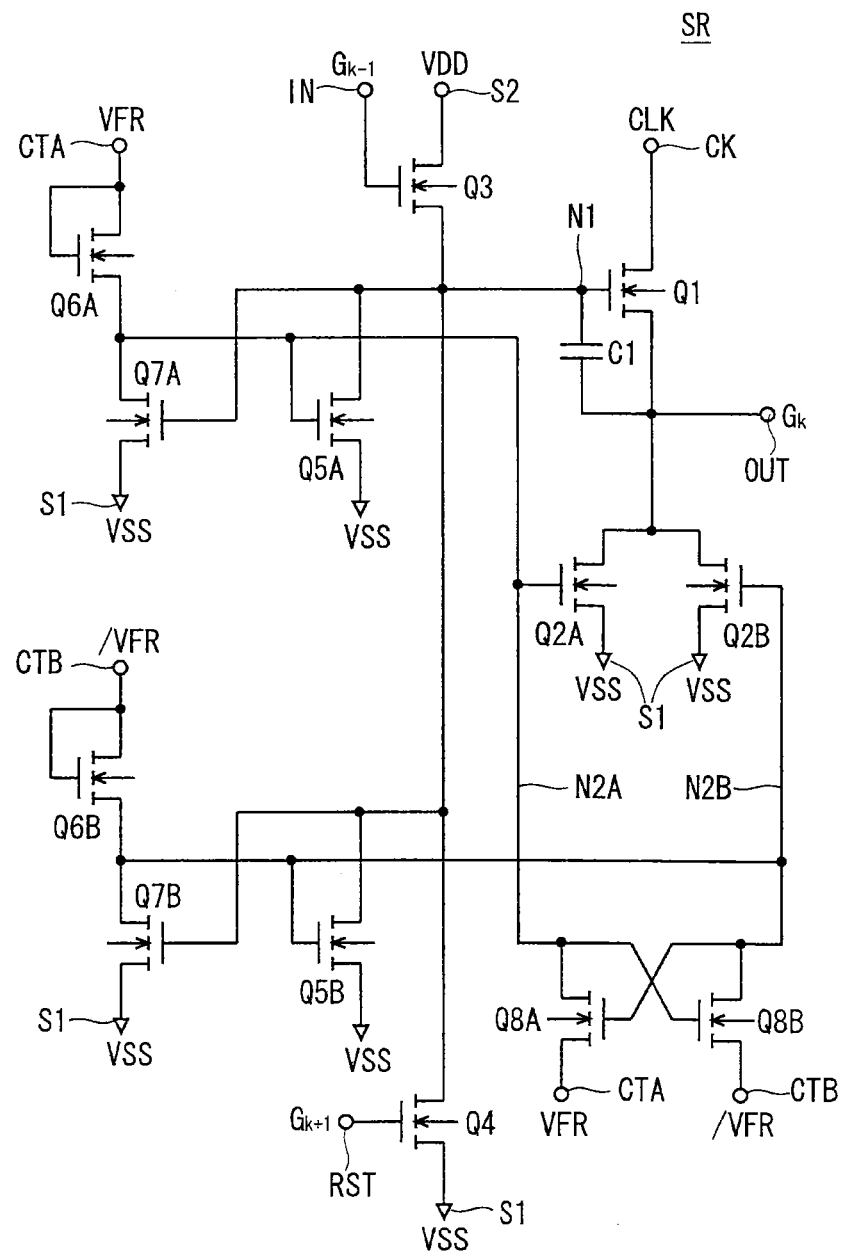
FIG. 11 is a circuit diagram showing a configuration of a unit shift register in accordance with a second preferred embodiment.

FIG. 11 is a circuit diagram showing a configuration of a unit shift register SR in accordance with the second preferred embodiment. Like the unit shift register disclosed in Japanese Patent Application Laid Open Gazette No. 2008-130139, the unit shift register of the second preferred embodiment has two output pull-down transistors and has such a configuration as to reduce the shift of a threshold voltage of the output pull-down transistors by alternately causing these output pull-down transistors to operate/halt.

A gate line driving circuit 30 of the second preferred embodiment is constituted of a plurality of cascaded unit shift registers SR shown in FIG. 11, like in the circuit of FIG. 2. As shown in FIG. 11, however, each unit shift register SR has a first control terminal CTA supplied with a first control signal VFR and a second control terminal CTB supplied with a second control signal /VFR. The first and second control signals VFR and /VFR are complementary to each other and generated by a controller in the gate line driving circuit 30. The first and second control signals VFR and /VFR are controlled to cause the levels to thereby change (alternate) in a blanking period between frames of a display image, and for example, controlled to cause the levels to thereby change per frame of the display image.

As shown in FIG. 11, an output stage of the unit shift register SR is constituted of the transistor Q1 connected between the output terminal OUT and the clock terminal CK and transistors Q2A and Q2B both of which are connected between the output terminal OUT and the first power supply terminal S1 (low-side power supply potential VSS). Specifically, the transistor Q1 serves to supply the clock signal inputted to the clock terminal CK to the output terminal OUT, and the transistors Q2A and Q2B serve to discharge the output terminal OUT. Herein, a node connected to the gate of the transistor Q1 is defined as a "node N1", a node connected to the gate of the transistor Q2A is defined as a "node N2A", and a node connected to the gate of the transistor Q2B is defined as a "node N2B".

The capacitive element C1 is provided between the gate and the source of the transistor Q1 (between the node N1 and the output terminal OUT). The capacitive element C1 serves to increase the effect of boosting the voltage of the node N1 which is caused by the level rise of the output terminal OUT. In a case where the gate-channel capacitance of the transistor Q1 is sufficiently large, however, the capacitive element C1 may be omitted since it can be substituted by the gate-channel capacitance.

Between the second power supply terminal S2 (high-side power supply potential VDD) and the node N1, connected is the transistor Q3 of which the gate is connected to input terminal IN. Between the node N1 and the first power supply terminal S1, connected are the transistor Q4 of which the gate is connected to a reset terminal RST, a transistor Q5A of which the gate is connected to the node N2A, and a transistor Q5B of which the gate is connected to the node N2B.

A transistor Q8A is connected between the first control terminal CTA and the node N2A, and a transistor Q8B is connected between the second control terminal CTB and the node N2B. The gate of the transistor Q8A is connected to the drain of the transistor Q8B (the node N2B) and the gate of the transistor Q8B is connected to the drain of the transistor Q8A (the node N2A). In other words, the transistors Q8A and Q8B constitute a flip-flop circuit in which the respective one main electrodes thereof (herein, drains) are connected to the control electrodes (gates) of the others in a crossing manner.

A transistor Q6A is connected between the first control terminal CTA and the node N2A and the gate thereof is connected to the first control terminal CTA (the transistor Q6A is diode-connected). A transistor Q7A is connected between the node N2A and the first power supply terminal S1 and the gate thereof is connected to the node N1. An on-state resistance of the transistor Q7A is set sufficiently lower than that of the transistor Q6A, and the transistors Q6A and Q7A constitute a ratio inverter using the node N1 as an input end and the node N2A as an output end. This ratio inverter, however, is different from a normal inverter and is supplied with the first control signal VFR as its power supply.

A transistor Q6B is connected between the second control terminal CTB and the node N2B and the gate thereof is connected to the second control terminal CTB (the transistor Q6B is diode-connected). A transistor Q7B is connected between the node N2B and the first power supply terminal S1 and the gate thereof is connected to the node N1. An on-state resistance of the transistor Q7B is set sufficiently lower than that of the transistor Q6B, and the transistors Q6B and Q7b constitute a ratio inverter using the node N1 as an input end and the node N2B as an output end. This ratio inverter, however, is different from a normal inverter and is supplied with the second control signal /VFR as its power supply.

In other words, the inverter constituted of the transistors Q6A an Q7A functions as an inverter when the first control signal VFR is in the H level while the inverter is not supplied with the power supply and is brought into a halt state when the first control signal VFR is in the L level. The inverter in the halt state cannot activate its output end (the node N2A). Similarly, the inverter constituted of the transistors Q6B an Q7B functions as an inverter when the second control signal /VFR is in the H level while the inverter is brought into a halt state and cannot activate its output end (the node N2B) when the second control signal /VFR is in the L level. Hereinafter, the inverter constituted of the transistors Q6A and Q7A is referred to as a "first inverter" and the inverter constituted of the transistors Q6B and Q7B is referred to as a "second inverter".

An operation of the unit shift register SR shown in FIG. 11 will be discussed. Also in the second preferred embodiment, it is assumed that the gate line driving circuit 30 is driven by the two clock signals CLK and /CLK of different phases, like in the circuit of FIG. 2.

For simple discussion, it is assumed that the respective H-level potentials of the clock signals CLK and /CLK and the first and second control signals VFR and /VFR are all equal to the high-side power supply potential VDD and the respective L-level potentials thereof are all equal to the low-side power supply potential VSS. The first and second control signals VFR and /VFR are controlled to cause the levels thereof to change per frame of the display image at a timing in the blanking period. Further, it is assumed that the respective threshold voltages of the transistors constituting the unit shift register SR are all equal, taking a value Vth.

Figure 12:
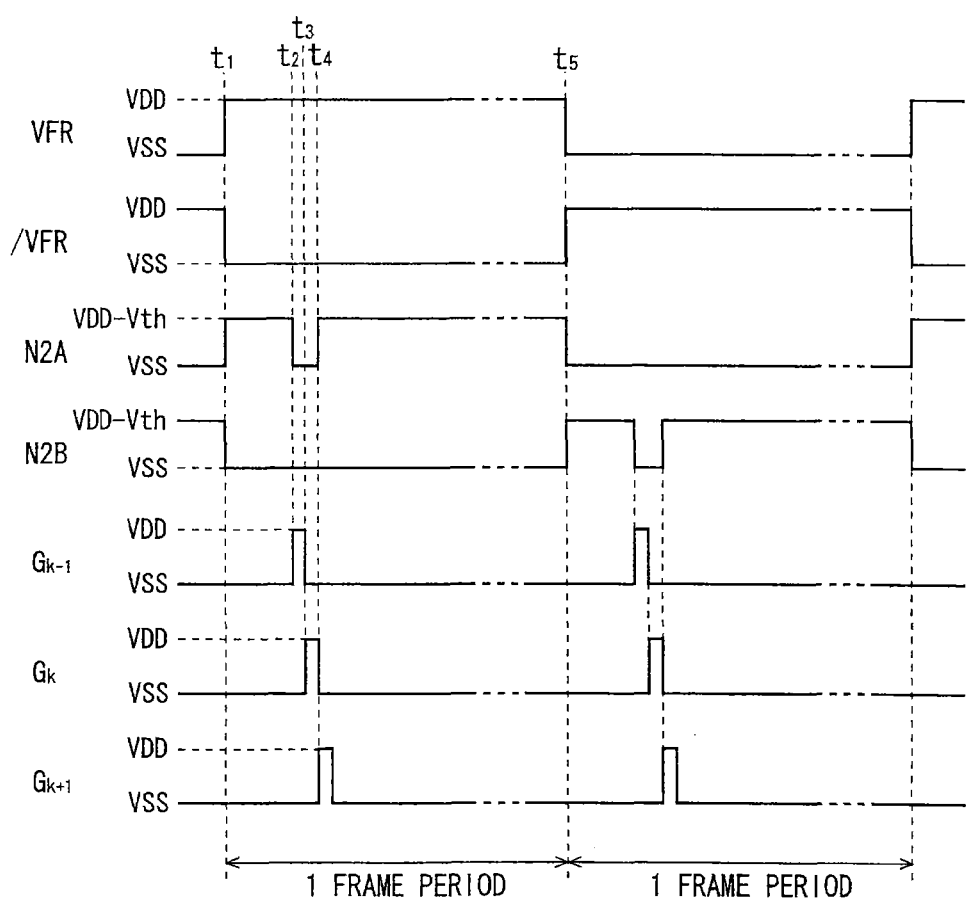
FIG. 12 is a signal waveform chart showing a normal operation of the unit shift register in accordance with the second preferred embodiment.

First, a normal operation of the unit shift register SR will be discussed. FIG. 12 is a timing chart showing the operation.

The time $t_1$ in FIG. 12 is present in the blanking period (not shown) between two frame periods. At the time $t_1$, the first control signal VFR is brought into the H level and the second control signal /VFR is brought into the L level.

Then, in each of all the unit shift registers SR, the potentials of the drain and the gate of the transistor Q6A are changed from VSS (=0) to VDD and the transistor Q6A is turned on. Specifically, the first inverter constituted of the transistors Q6A and Q7A is supplied with power supply and activated. At this point of time, the transistor Q5B has been turned on and the node N1 is in the L level. Therefore, since the transistor Q7A is in the OFF state, the level of the node N2 is raised by the turn-on of the transistor Q6A.

On the other hand, the potentials of the drain and the gate of the transistor Q6B are changed from VDD to VSS. Specifically, the second inverter constituted of the transistors Q6B and Q7B is not supplied with power supply and is brought into the halt state. Since the transistor Q6B functions as a diode with the direction from the second control terminal CTB toward the node N2B as a forward direction, the electric charges of the node N2B are not discharged through the transistor Q6B. Since the level of the node N2A rises and the potential of the source of the transistor Q8B (the second control terminal CTB) becomes VSS as discussed above, however, the transistor Q8B is turned on and discharges the node N2B to the L level (VSS).

Accordingly, the transistor Q8A is turned off and the node N2A is brought into the H level (VDD-Vth). In response to that, the transistor Q5A is turned on.

Thus, when the first control signal VFR becomes the H level and the second control signal /VFR becomes the L level, in each unit shift register SR, since the second inverter is brought into the halt state, the node N2B is fixed to the L level. Therefore, in this period, the transistors Q2B and Q5B are brought into the halt state (always OFF state) with the gates thereof not biased. In other words, in this period, a circuit equivalent to a normal unit shift register (the circuit shown in FIG. 1 of Patent Document 9 (Japanese Patent Application Laid Open Gazette No. 2004-246358)) is formed by combination of the transistors Q1, Q2A, Q3, Q4, Q5A, Q6A, and Q7A and the same operation as the normal unit shift register does can be performed in each unit shift register SR.

Herein, attention is directed to the k-th stage unit shift register SRk (assuming that the clock signal CLK is inputted to the clock terminal CK in the unit shift register SRk). At the time $t_2$ in a frame period immediately after the time $t_1$, when the output signal $G_{k-1}$ of the preceding stage is brought into the H level, the transistor Q3 is turned on in the unit shift register $SR_k$. At that time, though the transistor Q5A is also in the ON state, the on-state resistance of the transistor Q3 is set sufficiently lower than that of the transistor Q5A and the node N1 becomes the H level (VDD-Vth). In response to that, the transistor Q1 is turned on.

Further, since the first inverter constituted of the transistors Q6A and Q7A brings the node N2A into the L level, the transistors Q2A and Q5A are turned on. Hereinafter, a state where the node N1 is in the H level (i.e., where the transistor Q1 is in the ON state) is referred to as a "set state".

After that, when the output signal $G_{k-1}$ of the preceding stage is returned to the L level, the transistor Q3 is turned off but the node N1 is maintained at the H level in the floating state. For this reason, when the clock signal CLK becomes the H level at the time $t_3$, the output terminal OUT is charged through the transistor Q1 in the ON state and the output signal $G_k$ is brought into the H level. In other words, the gate line $GL_k$ is brought into the selected state.

At that time, the voltage of the node N1 is boosted by the coupling through the capacitive element C1 and the gate-channel capacitance of the transistor Q1 and the transistor Q1 operates in the non-saturated region. Accordingly, the H-level potential of the output signal $G_k$ rises to VDD which is the same as that of the clock signal CLK.

When the clock signal CLK is returned to the L level, the output terminal OUT is discharged through the transistor Q1 and the output signal $G_k$ is thereby returned to the L level (VSS). At that time, the potential of the node N1 is lowered by the coupling through the capacitive element C1 and the gate-channel capacitance of the transistor Q1 and returned to the potential (VDD-Vth) before being boosted.

Subsequently, at the time $t_4$, when the output signal $G_{k+1}$ of the subsequent stage (the unit shift register $SR_{k+1}$) becomes the H level, the transistor Q4 is turned on in the unit shift register $SR_k$. In response to that, the node N1 becomes the L level and the transistor Q1 is returned to the OFF state. Hereinafter, a state where the node N1 is in the L level (i.e., where the transistor Q1 is in the OFF state) is referred to as a "reset state".

At that time, the transistor Q7 is turned off and the node N2A becomes the H level (VDD-Vth). As a result, the transistor Q2A is turned on and the output terminal OUT is maintained at the L level with low impedance. The transistor Q5A is also turned on. The transistor Q5A serves to maintain the node N1 at the L level with low impedance while the node N2A is in the H level. It is thereby possible to prevent the level rise of the node N1 due to the effect of a noise in the non-selection period and suppress a malfunction of the unit shift register SRk.

After that, the unit shift register SRk is maintained in the reset state until the respective levels of the first and second control signals VFR and /VFR are inverted at the time $t_5$ in the next blanking period.

At the time $t_5$, when the first control signal VFR is brought into the L level and the second control signal /VFR is brought into the H level, in each unit shift register SR, contrary to the above, the second inverter constituted of the transistors Q6B and Q7B is activated and the node N2B is brought into the H level. In response to that, since the transistor Q8A is turned on and the first inverter is brought into the halt state, the node N2A becomes the L level (VSS).

In the frame period immediately after the time $t_5$, the transistors Q2A and Q5A are brought into the halt state with the gates thereof not biased. The first inverter is also brought into the halt state since no power supply is supplied thereto. As a result, in the unit shift register SRk, a circuit equivalent to a normal unit shift register (the circuit shown in FIG. 1 of Patent Document 9 (Japanese Patent Application Laid Open Gazette No. 2004-246358)) is formed by combination of the transistors Q1, Q2B, Q3, Q4, Q5B, Q6B, and Q7B and the same operation as performed at the times $t_2$ to $t_5$ can be thereby performed Thus, the unit shift register SRk shown in FIG. 11 can perform the same operation as the normal unit shift register does. Further, since a pair of the transistors Q2A and Q5A and another pair of the transistors Q2B and Q5B are alternately brought into the halt state every time when the first and second control signals VFR and /VFR are inverted, it is possible to prevent the gates thereof from being DC biased. Therefore, it is possible to prevent a malfunction due to a shift in the threshold voltage of an a-Si TFT and increase the reliability of the operation.

Figure 13:
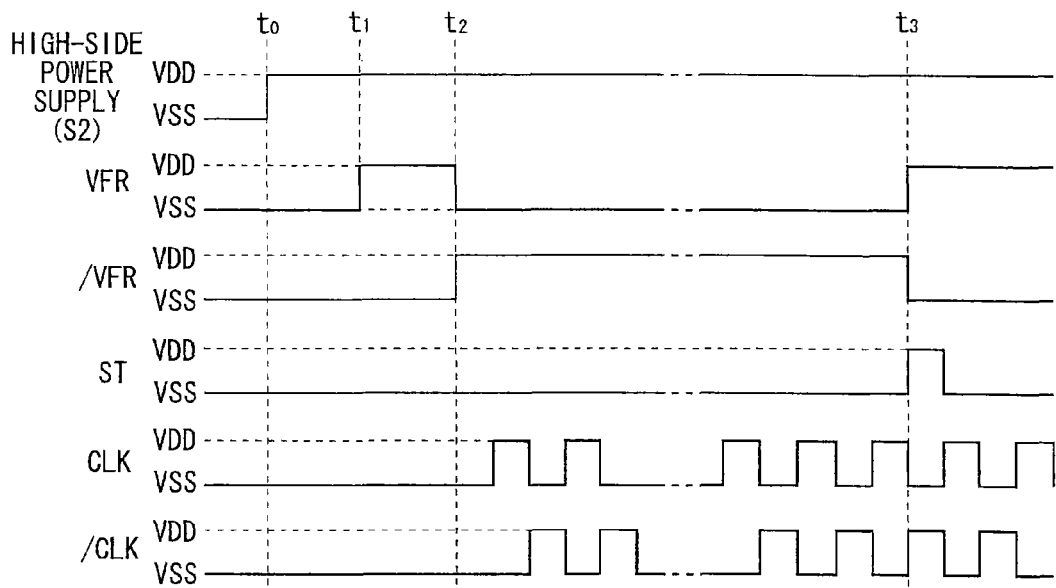
FIG. 13 is a signal waveform chart used for explanation of an initial reset operation of the unit shift register in accordance with the second preferred embodiment.

Next, an initial reset operation of the unit shift register SR of the second preferred embodiment at power-on will be discussed. FIG. 13 is a timing chart showing the operation.

The time $t_0$ in FIG. 13 is the power-on of the gate line driving circuit 30. At that time, the potential of the high-side power supply (the second power supply terminal S2) rises to VDD. Though the potential of the low-side power supply becomes VSS, since it is assumed that VSS=0, the potential of the first power supply terminal S1 does not change at power-on. Immediately after the time $t_0$, the levels of the output signals $G_1, G_2, \ldots$ of the gate line driving circuit 30 are in an unsteady state.

In the second preferred embodiment, the first control signal VFR is controlled to come into the H level (active level) at the time $t_1$ before the start of the operation of the clock signals CLK and /CLK. When the first control signal VFR is brought into the H level at the time $t_1$, in each unit shift register SR, the transistor Q6A is turned on and the node N2A is initialized to the H level, In response to that, the transistor Q5A is turned on and the node N1 is initialized to the L level. Accordingly, the transistor Q1 is turned off and the transistor Q2A is turned on, and the output terminal OUT (the output signal G) is brought into the L level with low impedance.

At the time $t_1$, only the first control signal VFR is brought into the H level and the second control signal /VFR is maintained at the L level (inactive level). For this reason, the transistor Q8 is turned on and the node N2B is initialized to the L level.

Subsequently, from the time $t_2$, the clock signals CLK and /CLK start operating (alternately start to be activated). After that, at the time $t_3$, when the start pulse ST to be supplied to the first-stage unit shift register $SR_1$ is activated, the above-discussed normal operation is sequentially performed in the plurality of cascaded unit shift registers SR from that time on.

Thus, in the second preferred embodiment, by activating the first control signal VFR before the clock signals CLK and /CLK start to alternate, the initial reset operation for the unit shift registers SR is performed. Though the first control signal VFR is activated for the initial reset operation in the above exemplary case, the second control signal /VFR may be activated.

If the clock signals CLK and /CLK start to alternate before the activation of the first and second control signals VFR and /VFR, there is a possibility that such a malfunction as discussed below will occur.

Immediately after power-on, since both the first and second control signals VFR and /VFR are VSS (=0V), both the transistors Q6A and Q6B are in the OFF state and both the transistors Q5A and Q5B are also in the OFF state in each unit shift register SR. For this reason, the node N1 is in the high impedance state. In this state, when the clock signals CLK and/CLK start operating, the level of the node N1 is raised by the coupling through the gate-drain overlap capacitance of the transistor Q1 at the rise of the clock signals CLK and /CLK.

If the level rise of the node N1 is large, the transistor Q1 is thereby turned on, and when the clock signals CLK and /CLK are activated, the output signal G is activated as a wrong signal in each unit shift register SR.

When attention is directed to the unit shift register SRk in which the clock signal CLK is inputted to the clock terminal CK, when the clock signal /CLK is activated, wrong signals are generated at the same time both in the preceding stage (the unit shift register $SR_{k-1}$) and the subsequent stage (the unit shift register $SR_{k+1}$). In other words, the output signal $G_{k-1}$ of the preceding stage and the output signal $G_{k+1}$ of the subsequent stage are activated at the same time. At that time, in the unit shift register $SR_k$, since both the transistors Q3 and Q4 are turned on, through current is generated to flow from the second power supply terminal S2 to the first power supply terminal S1.

Further, even if the first control signal VFR (or the second control signal /VFR) is brought into the H level in such a state where the level rise of the node N1 is large, since both the transistors Q7A and Q7B are in the ON state, through current is generated to flow from the first control terminal CTA (or the second control terminal CTB) to the first power supply terminal S1 through the transistors Q6A and Q7A (or the transistors Q6B and Q7B) and the malfunction continues, not being corrected.

In contrast to the above case, in the second preferred embodiment, the first control signal VFR (or the second control signal /VFR) is activated before the clock signals CLK and /CLK start operating. Accordingly, at the point of time when the clock signals CLK and /CLK start operating, the node N2A (or the node N2B) is initialized to the H level and the node N1 is initialized to the L level, and the output terminal OUT (the output signal G) is in the L level with low impedance. Therefore, even if the clock signals CLK and /CLK are inputted, the respective levels of the node N1 and the output terminal OUT do not rise and the above malfunction in which the output signal $G_n$ is activated as a wrong signal does not occur.

The interval from the time when the first control signal VFR (or the second control signal /VFR) is activated to the time when the clock signals CLK and /CLK start operating normally has only to be 1 pulse width of the clock signals CLK and /CLK or more. For example, immediately after power-off, however, the node N1 is in the H level with high impedance in some cases, and if such a case is possible, the above interval needs to be longer.

This will be discussed with reference to the timing chart of FIG. 13. It is assumed that the time $t_0$ of power-on is immediately after the preceding power-off and the node N1 in each unit shift register SR is in the H level at the time $t_1$. In this case, at the time $t_1$, when the first control signal VFR is brought into the H level, the transistor Q6A is turned on, but since the node N1 is in the H level, the transistor Q7A is also turned on and the potential of the node N2A does not rise. This is because the transistors Q6A and Q7A constitute the ratio inverter and the on-state resistance of the transistor Q7A is set lower than that of the transistor Q6A.

At that time, the higher the potential of the node N1 is, the lower the potential of the node N2A becomes and the higher the impedance of the transistor Q5A becomes. Then, it takes longer to lower the level of the node N1 to the L level. Therefore, the interval from the time when the first control signal VFR (or the second control signal /VFR) is activated to the time when the clock signals CLK and /CLK start operating needs to be longer.

[The First Variation]

Figure 14:
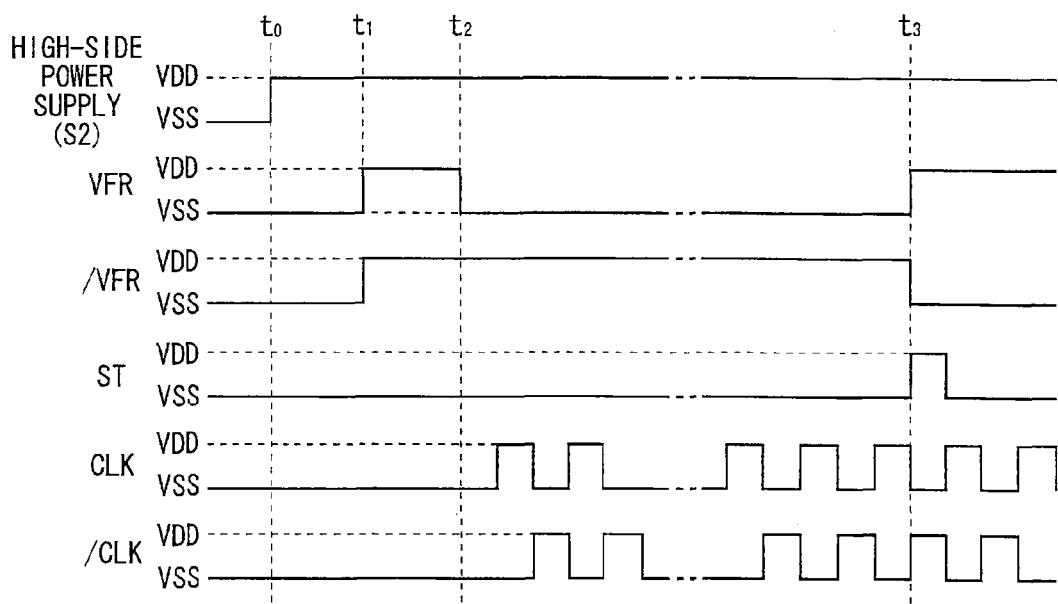
FIG. 14 is a signal waveform chart used for explanation of an initial reset operation of a unit shift register in accordance with a first variation of the second preferred embodiment.

FIG. 14 is a signal waveform chart used for explanation of an initial reset operation of the unit shift register SR (shown in FIG. 11) in accordance with the first variation of the second preferred embodiment. In the first variation, after the power-on of the gate line driving circuit 30, during a certain period (from the time $t_1$ to the time $t_2$) before the clock signals CLK and /CLK start operating, both the first control signal VFR and the second control signal /VFR are set to the H level.

As discussed above, in the unit shift register SR of FIG. 11, in the case where the node N1 is brought into the H level with high impedance at power-on, even if the first control signal VFR is activated for the initial reset operation after the power-on (at the time $t_1$) as shown in FIG. 13, it takes longer to initialize the node N1 to the L level since the impedance of the transistor Q5A is high.

In the first variation, since both the first control signal VFR and the second control signal /VFR are brought into the H level in the initial reset operation, both the transistors Q6A and Q6B are turned on. At that time, if the node N1 is in the H level with high impedance, the potentials of the nodes N2A and N2B do not rise since both the transistors Q7A and Q7B are in the ON state. For this reason, though the impedances of the transistors Q5A and Q5B are high, the node N1 can be initialized to the L level more quickly than in the case of FIG. 13 since the node N1 is discharged by the two transistors Q5A and Q5B.

Therefore, in the first variation, it is possible to shorten the time required for the initial reset operation (the time period from the power-on to the time when the clock signals CLK and /CLK start operating). Both the first and second control signals VFR and /VFR are set to the H level only in the initial reset operation, and in the normal operation, the first and second control signals VFR and /VFR are complementary to each other.

[The Second Variation]

Figure 15:
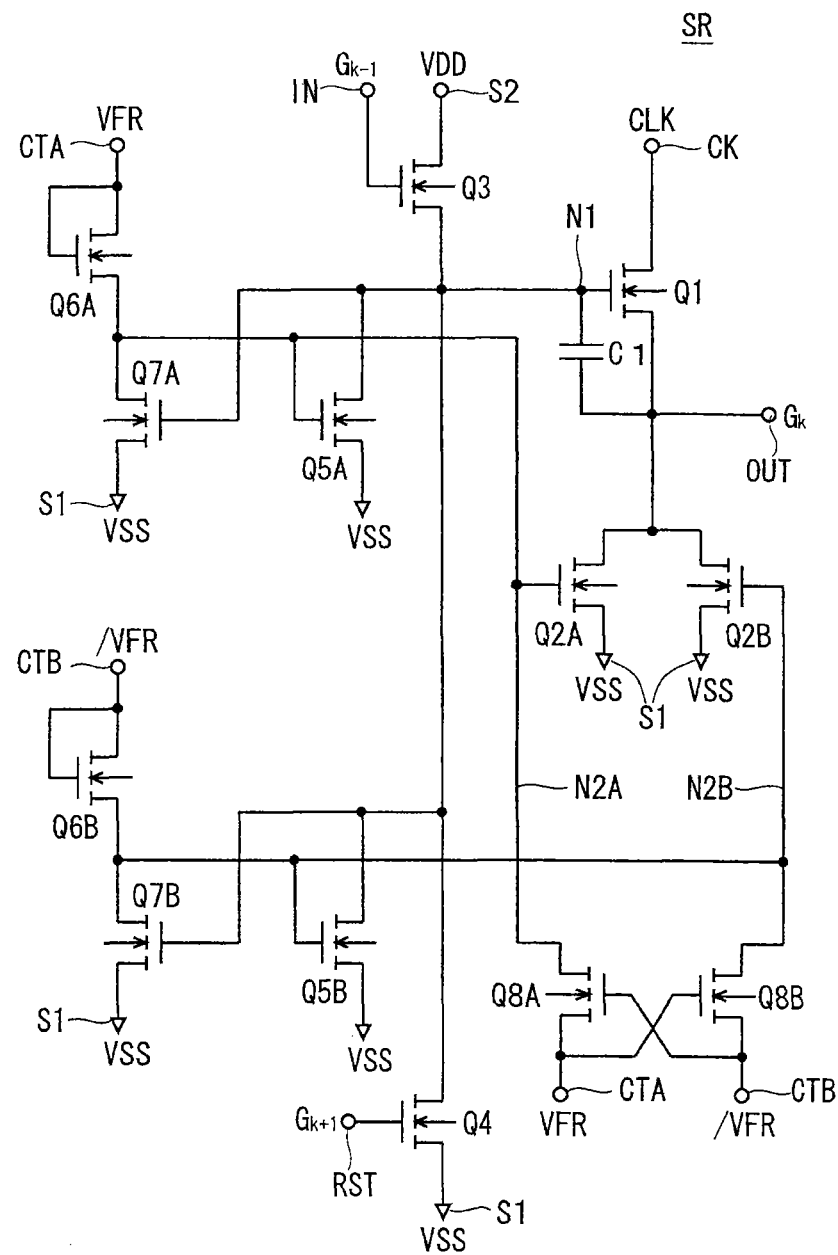
FIG. 15 is a circuit diagram showing a unit shift register in accordance with a second variation of the second preferred embodiment.

FIG. 15 is a circuit diagram showing a unit shift register SR in accordance with the second variation of the second preferred embodiment. In the second variation, the respective main electrodes of the transistors Q8A and Q8B which are connected to the gates of the other transistors are changed to the sources thereof in the circuit of FIG. 11. Respective on-state resistances (impedances) of the transistors Q8A and Q8B are set sufficiently lower than those of the transistors Q6A and Q6B and set lower than those of the transistors Q7A and Q7B.

While the switching between ON and OFF of the transistors Q8A and Q8B in the circuit of FIG. 11 is performed by the output signals of the first and second inverters, respectively, the switching is performed by the first and second control signals VFR and /VFR in the unit shift register SR of the second variation. Except this point, an operation of the unit shift register SR of FIG. 15 is the same as that of the unit shift register SR shown in FIG. 11.

In the second variation, like in the first variation, it is possible to further shorten the time required to initialize the node N1 to the L level in the case where both the first and second control signals VFR and /VFR are set to the H level in the initial reset operation. This will be discussed with reference to the timing chart of FIG. 14.

In the unit shift register SR of FIG. 15, after power-on (at the time $t_1$), when both the first and second control signals VFR and /VFR are brought into the H level, not only the transistors Q6A and Q6B but also the transistors Q8A and Q8B are turned on. As discussed above, the respective on-state resistances of the transistors Q8A and Q8B are set sufficiently lower than those of the transistors Q6A and Q6B and set lower than those of the transistors Q7A and Q7B. For this reason, even if the node N1 is in the H level with high impedance and the transistors Q7A and Q7B are in the ON state, when the transistors Q8A and Q8B are turned on, the nodes N2A and N2B can be brought into the H level quickly.

In response to that, the transistors Q5A and Q5B are turned on and the node N1 is initialized to the L level. As a result, since the transistor Q1 is turned off and the transistors Q2A and Q2B are turned on, the output terminal OUT can be initialized to the L level with low impedance. Therefore, it is possible to prevent the rise of the potential of the node N1 in response to the activation of the clock signals CLK and /CLK, and no malfunction occurs in which the output signal $G_k$ is activated as a wrong signal.

In the second variation, even if the node N1 is in the H level with high impedance immediately after power-on, the interval from the time when the first and second control signals VFR and /VFR are activated to the time when the clock signals CLK and /CLK start operating has only to be 1 pulse width of the clock signals CLK and /CLK or more.

While the invention has been shown and described in detail, the foregoing description is in all aspects illustrative and not restrictive. It is therefore understood that numerous modifications and variations can be devised without departing from the scope of the invention.

What is claimed is:

1. A shift register circuit comprising:
   an input terminal, an output terminal, and a clock terminal;
   a first transistor configured to supply said output terminal with a clock signal inputted to said clock terminal;
   second and third transistors each configured to charge said output terminal; and
   a driving circuit configured to drive said second transistor when a first control signal is active, said driving circuit driving said third transistor when a second control signal is active,
   wherein nodes connected to respective control electrodes of said first, second, and third transistors are defined as first, second, and third nodes, respectively,
   said shift register circuit further comprising
   a fourth transistor having a control electrode connected to said second node, configured to discharge said first node; and
   a fifth transistor having a control electrode connected to said third node, configured to discharge said first node,
   wherein at least one of said first and second control signals is activated for a predetermined time period before said clock signal first starts operating after power-on.

2. The shift register circuit according to claim 1, wherein said driving circuit includes
   a first inverter using said first control signal as a power supply, said first node as an input end, and said second node as an output end; and
   a second inverter using said second control signal as a power supply, said first node as an input end, and said third node as an output end.

3. The shift register circuit according to claim 1, wherein said predetermined time period is not less than 1 pulse width of said clock signal.

* * * * *